(12) United States Patent
Anderson et al.

(10) Patent No.: US 8,901,710 B2
(45) Date of Patent: Dec. 2, 2014

(54) INTERDIGITATED CAPACITORS WITH A ZERO QUADRATIC VOLTAGE COEFFICIENT OF CAPACITANCE OR ZERO LINEAR TEMPERATURE COEFFICIENT OF CAPACITANCE

(71) Applicant: International Business Machines Corporation, Armonk, NY (US)

(72) Inventors: Frederick G. Anderson, South Burlington, VT (US); Natalie B Feilchenfeld, Jericho, VT (US); Zhong-Xiang He, Essex Junction, VT (US); Theodore J. Letavic, Putnam Valley, NY (US); Yves T. Ngu, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/778,321

(22) Filed: Feb. 27, 2013

(65) Prior Publication Data

US 2014/0239448 A1    Aug. 28, 2014

(51) Int. Cl.
*H01L 21/20* (2006.01)
*H01L 49/02* (2006.01)

(52) U.S. Cl.
CPC .................................. *H01L 28/60* (2013.01)
USPC .... 257/534; 257/307; 257/532; 257/E21.008; 257/E21.016

(58) Field of Classification Search
CPC ..... H01L 21/20; H01L 21/62; H01L 23/5223; H01L 27/0805; H01L 28/40; H01L 28/60; H01L 29/00; H01L 33/00
See application file for complete search history.

(56) References Cited

U.S. PATENT DOCUMENTS

| | | | | |
|---|---|---|---|---|
| 4,868,711 A | * | 9/1989 | Hirama et al. | 361/321.3 |
| 6,919,233 B2 | * | 7/2005 | Papa Rao et al. | 438/128 |
| 7,585,722 B2 | * | 9/2009 | Edelstein et al. | 438/239 |
| 7,645,675 B2 | * | 1/2010 | Coolbaugh et al. | 438/381 |
| 7,816,197 B2 | | 10/2010 | Kim et al. | |
| 8,039,354 B2 | * | 10/2011 | Chinthakindi et al. | 438/393 |

(Continued)

OTHER PUBLICATIONS

Yang, et al., "Effective Modulation of Quadratic Voltage Coefficient of Capacitance in MIM Capacitors Using Sm2O3/SiO2 Dielectric Stack," IEEE Eelectron Device Letters, vol. 30, No. 5, May 2009, pp. 460-462.

(Continued)

*Primary Examiner* — Minh-Loan Tran
*Assistant Examiner* — Fazli Erdem
(74) *Attorney, Agent, or Firm* — Gibb & Riley, LLC; Anthony J. Canale

(57) ABSTRACT

Disclosed are an interdigitated capacitor and an interdigitated vertical native capacitor, each having a relatively low (e.g., zero) net coefficient of capacitance with respect to a specific parameter. For example, the capacitors can have a zero net linear temperature coefficient of capacitance ($T_{cc}$) to limit capacitance variation as a function of temperature or a zero net quadratic voltage coefficient of capacitance ($V_{cc2}$) to limit capacitance variation as a function of voltage. In any case, each capacitor can incorporate at least two different plate dielectrics having opposite polarity coefficients of capacitance with respect to the specific parameter due to the types of dielectric materials used and their respective thicknesses. As a result, the different dielectric plates will have opposite effects on the capacitance of the capacitor that cancel each other out such that the capacitor has a zero net coefficient of capacitance with respect to specific parameter.

20 Claims, 18 Drawing Sheets

(56) References Cited

U.S. PATENT DOCUMENTS

| | | | |
|---|---|---|---|
| 8,101,495 B2 * | 1/2012 | Riess et al. | 438/396 |
| 8,120,143 B2 * | 2/2012 | Edelstein et al. | 257/532 |
| 8,237,243 B2 * | 8/2012 | Daley et al. | 257/532 |
| 8,314,452 B2 * | 11/2012 | Riess et al. | 257/307 |
| 8,378,450 B2 * | 2/2013 | Booth et al. | 257/532 |
| 2005/0173778 A1 * | 8/2005 | Won et al. | 257/532 |
| 2006/0017136 A1 * | 1/2006 | Won et al. | 257/532 |
| 2007/0152295 A1 * | 7/2007 | Yeh et al. | 257/516 |
| 2008/0130200 A1 | 6/2008 | Edelstein et al. | |
| 2010/0002358 A1 * | 1/2010 | Defay et al. | 361/313 |
| 2010/0207246 A1 | 8/2010 | Booth, Jr. et al. | |
| 2011/0133600 A1 * | 6/2011 | Kimura et al. | 310/313 B |
| 2011/0298090 A1 * | 12/2011 | Park et al. | 257/532 |
| 2012/0098045 A1 * | 4/2012 | Tian et al. | 257/296 |
| 2012/0211868 A1 * | 8/2012 | Stribley et al. | 257/532 |
| 2012/0326270 A1 | 12/2012 | Thompson et al. | |
| 2014/0035436 A1 * | 2/2014 | Ruile et al. | 310/313 R |

OTHER PUBLICATIONS

Kim, et al., "Improvement of Voltage Linearity in High-K MIM Capacitors Using HfO2—SiO2 Stacked Dielectric," IEEE Electron Device Letters, vol. 25, Issue 8, Aug. 2004, pp. 538-540.

Jorel, et al., "High Performance Metal-Insulator-Metal Capacitor Using a SrTiO3/ZrO2 Bilayer," Applied Physics Letters 94, 2009, 3 pages.

Ng, et al., "MIM Capacitor Integration for Mixed-Signal/RF Applications," IEEE Transactions on Electron Dervices, vol. 52, Issue 7, Jul. 2005, pp. 1399-1409.

\* cited by examiner

INTERDIGITATED CAPACITORS WITH A ZERO QUADRATIC VOLTAGE COEFFICIENT OF CAPACITANCE OR ZERO LINEAR TEMPERATURE COEFFICIENT OF CAPACITANCE

BACKGROUND

The disclosed structures and methods relate to interdigitated capacitors having either a relatively low (e.g., zero) net linear temperature coefficient of capacitance or a relatively low (e.g., zero) net quadratic voltage coefficient of capacitance.

For a given on-chip capacitor, capacitance will vary as a function of temperature and applied voltage. Specifically, capacitance as a function of temperature can be estimated using the following expression:

$$C(T)=C_0*(1+T_{cc}*(T-25)), \quad (1)$$

where C(T) represents capacitance as a function of voltage, $C_0$ is capacitance value at a temperature of 25 degree Celsius (25° C.), $T_{cc}$ represents a linear temperature coefficient of capacitance and T represents temperature. Additionally, capacitance as a function of voltage can be estimated using the following expression:

$$C(V)=C_0(1+V_{cc1}*V+V_{cc2}*V^2), \quad (2)$$

where C(V) represents capacitance as a function of voltage, $C_0$ is capacitance value at voltage of zero volt, $V_{cc1}$ represents a linear voltage coefficient of capacitance and is typically equal to zero for an interdigitated capacitor, V represents applied voltage and $V_{cc2}$ represents a quadratic voltage coefficient of capacitance. Thus, capacitance will vary linearly as a function of temperature such that the greater the operating temperature range, the greater the variation in capacitance. Furthermore, capacitance will vary both linearly and quadratically as a function of voltage such that the greater the operating voltage range, the greater the variation in capacitance. Additionally, the fact that capacitance varies quadratically as a function of voltage becomes particularly problematic in high voltage technologies. Therefore, it would be advantageous to provide a capacitor (e.g., a simple interdigitated capacitor, also referred to herein as a comb capacitor, or an interdigitated vertical native capacitor) with a specific, relatively low (e.g., zero), linear temperature coefficient of capacitance ($T_{cc}$) or quadratic voltage coefficient of capacitance ($V_{cc2}$) in order to limit capacitance variation in high temperature and/or high voltage applications.

SUMMARY

In view of the foregoing, disclosed herein are capacitors and, particularly, a simple interdigitated capacitor and an interdigitated vertical native capacitor, each having a relatively low (e.g., zero) net coefficient of capacitance with respect to a specific parameter so as to limit capacitance variation as a function of that specific parameter. For example, the capacitors can have a relatively low (e.g., zero) net linear temperature coefficient of capacitance (net $T_{cc}$) to limit capacitance variation as a function of temperature (e.g., in high operating temperature applications). Alternatively, the capacitors can have a relatively low (e.g., zero) net quadratic voltage coefficient of capacitance (net $V_{cc2}$) to limit capacitance variation as a function of voltage (e.g., in high voltage applications). In any case, each capacitor can incorporate at least two different plate dielectrics. The two different plate dielectrics can have different and, particularly, opposite polarity coefficients of capacitance with respect to the specific parameter due to the types of dielectric materials used and their respective thicknesses. As a result, the different dielectric plates will have opposite effects on the capacitance of the capacitor and these opposite effects will cancel each other out such that the capacitor has a relatively low (e.g., zero) net coefficient of capacitance with respect to the specific parameter.

More particularly, disclosed herein are a simple interdigitated capacitor and an interdigitated vertical native capacitor. The simple interdigitated capacitor and the interdigitated vertical native capacitor can each comprise a first dielectric layer having a top surface and a first coefficient of capacitance with respect to a specific parameter (e.g., a first linear temperature coefficient of capacitance ($1^{st} T_{cc}$) or a first quadratic voltage coefficient of capacitance ($1^{st} V_{cc2}$)). First metal wires (e.g., positively biased metal wires) and second metal wires (e.g., negatively biased metal wires) can be in the first dielectric layer at the top surface such that the first metal wires are interdigitated with and electrically isolated from the second metal wires. A second dielectric layer can be positioned on the top surface of the first dielectric layer such that it extends laterally over and, particularly, covers the first metal wires and the second metal wires.

For a simple interdigitated capacitor, the second dielectric layer completes the capacitor structure. For an interdigitated vertical native capacitor, additional first metal wires (e.g., additional positively biased metal wires) and additional second metal wires (e.g., additional negatively biased wires) can be in the second dielectric layer. The additional first metal wires can be interdigitated with and electrically isolated from the additional second wires. Furthermore, the additional first metal wires can be aligned above and electrically connected to the first metal wires in the first dielectric layer (e.g., by vias) and the additional second metal wires can be aligned above and electrically connected to the second metal wires in the first dielectric layer (e.g., also by vias).

In any case, the second dielectric layer can have a second coefficient of capacitance with respect to the specific parameter (e.g., a second linear temperature coefficient of capacitance ($2^{nd} T_{cc}$) or a second quadratic voltage coefficient of capacitance ($2^{nd} V_{cc2}$), as applicable), which is different from the first coefficient of capacitance. Specifically, the first coefficient of capacitance and the second coefficient of capacitance can have opposite polarities and can be approximately equal in magnitude such that the capacitor (be it a simple interdigitated capacitor or an interdigitated vertical native capacitor) has a specific net coefficient of capacitance of approximately zero with respect to the specific parameter (e.g., an approximately zero net linear temperature coefficient of capacitance (zero net $T_{cc}$) or an approximately zero quadratic voltage coefficient of capacitance (zero net $V_{cc2}$), as applicable).

Also disclosed herein are methods of forming the above-described simple interdigitated capacitor and the above-described interdigitated vertical native capacitor. To form either of these capacitors, a first dielectric layer having a top surface and a first coefficient of capacitance with respect to a specific parameter (e.g., a first linear temperature coefficient of capacitance ($1^{st} T_{cc}$) or a first quadratic voltage coefficient of capacitance ($1^{st} V_{cc2}$)) can be formed. Next, first metal wires (which will be positively biased metal wires in the final structure) and second metal wires (which will be negatively biased metal wires in the final structure) can be formed in the first dielectric layer at the top surface such that the first metal wires are interdigitated with and electrically isolated from the second metal wires. Then, a second dielectric layer can be formed on the top surface of the first dielectric layer so as to extend laterally over and, particularly, cover the first metal wires and the second metal wires.

For a simple interdigitated capacitor, formation of the second dielectric layer can be the final process step. However, for an interdigitated vertical native capacitor, formation of the second dielectric layer is only an intermediate process step and the method can further comprise forming additional first metal wires and additional second metal wires in the second dielectric layer such that the additional first metal wires are interdigitated with and electrically isolated from the additional second metal wires, such that the additional first metal wires are aligned above and electrically isolated from the first metal wires and such that the additional second metal wires are aligned above and electrically isolated from the second metal wires.

In any case, the second dielectric layer can be formed so as to have a second coefficient of capacitance with respect to the specific parameter (e.g., a second linear temperature coefficient of capacitance ($2^{nd}$ $T_{cc}$) or a second quadratic voltage coefficient of capacitance ($2^{nd}$ $V_{cc2}$)), which is different from the first coefficient of capacitance. Specifically, the first coefficient of capacitance of the first dielectric layer and the second coefficient of capacitance of the second dielectric layer can have opposite polarities and can be approximately equal in magnitude such that the capacitor (be it a simple interdigitated capacitor or an interdigitated vertical native capacitor) has a specific net coefficient of capacitance of approximately zero with respect to the specific parameter (e.g., an approximately zero linear temperature coefficient of capacitance (zero net $T_{cc}$) or an approximately zero quadratic voltage coefficient of capacitance (zero net $V_{cc2}$), as applicable).

Also disclosed herein is a design structure for the above-described capacitors. Specifically, this design structure (e.g., a hardware description language (HDL) design structure) can be encoded on a machine-readable data storage medium. It can, for example, comprise data and instruction elements that are executable by a computer in a computer-aided design system in order to generate a machine-executable representation of any of the above-described capacitors.

BRIEF DESCRIPTION OF THE DRAWINGS

The devices and methods disclosed herein will be better understood from the following detailed description with reference to the drawings, which are not necessarily drawn to scale and in which.

DETAILED DESCRIPTION

As mentioned above, for a given on-chip capacitor, capacitance will vary as a function of temperature and applied voltage. Specifically, capacitance will vary linearly as a function of temperature (see expression (1) above) such that the greater the operating temperature range, the greater the variation in capacitance. Furthermore, capacitance will vary both linearly and quadratically as a function of voltage (see expression (2) above) such that the greater the operating voltage range, the greater the variation in capacitance. Additionally, the fact that capacitance varies quadratically as a function of voltage becomes particularly problematic in high voltage technologies.

In view of the foregoing, disclosed herein are capacitors and, particularly, a simple interdigitated capacitor and an interdigitated vertical native capacitor, each having a relatively low (e.g., zero) net coefficient of capacitance with respect to a specific parameter so as to limit capacitance variation as a function of that specific parameter. For example, the capacitors can have a relatively low (e.g., zero)

net linear temperature coefficient of capacitance (zero net $T_{cc}$) to limit capacitance variation as a function of temperature (e.g., in high temperature applications). Alternatively, the capacitors can have a relatively low (e.g., zero) net quadratic voltage coefficient of capacitance (zero net $V_{cc2}$) to limit capacitance variation as a function of voltage (e.g., in high voltage applications). In any case, each capacitor can incorporate at least two different plate dielectrics. The two different plate dielectrics can have different and, particularly, opposite polarity coefficients of capacitance with respect to the specific parameter due to the types of dielectric materials used and their respective thicknesses. As a result, the different dielectric plates will have opposite effects on the capacitance of the capacitor and these opposite effects will cancel each other out such that the capacitor has a relatively low (e.g., zero) net coefficient of capacitance with respect to the specific parameter.

Figure 1A:
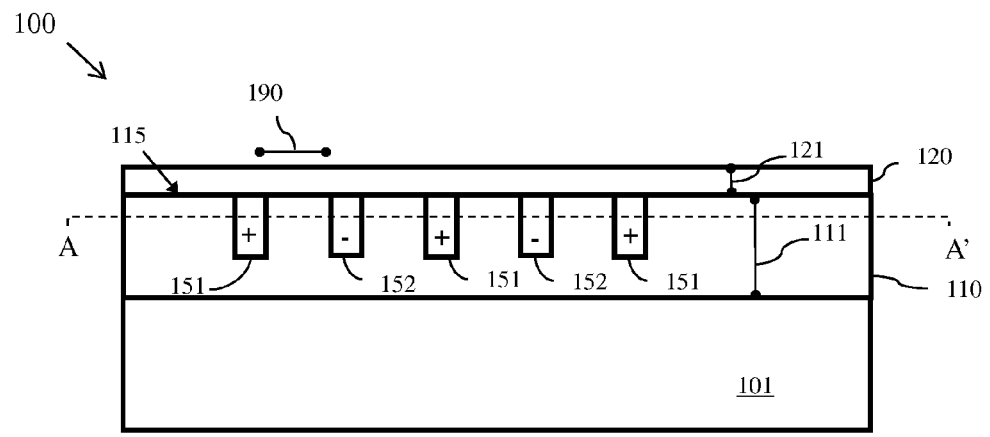
FIG. 1A is a vertical cross-section diagram of a simple interdigitated capacitor.
Figure 1B:
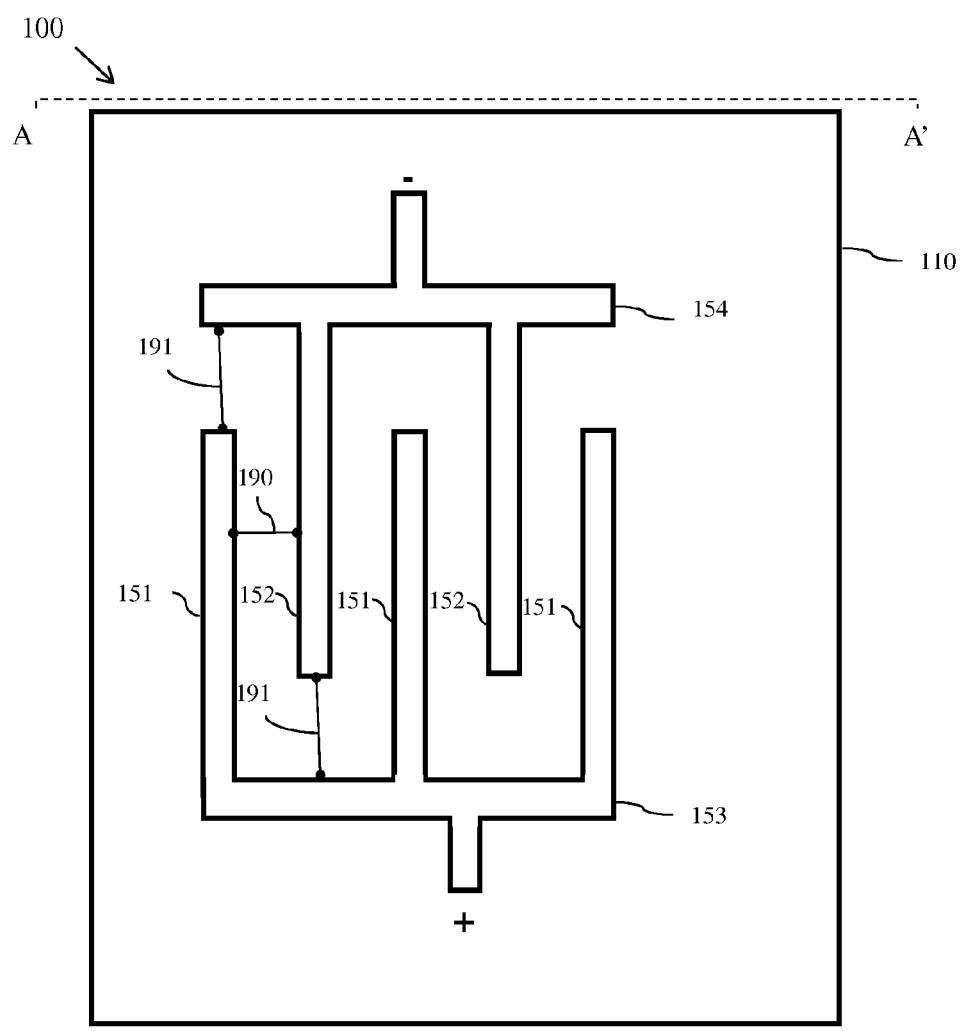
FIG. 1B is a horizontal cross-section diagram of the same simple interdigitated capacitor as shown in FIG. 1A.
Figure 2A:
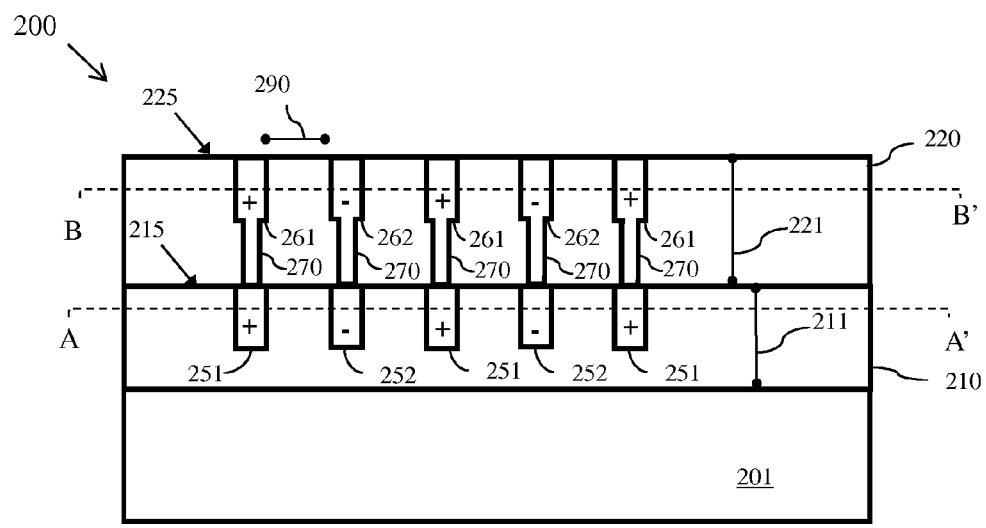
FIG. 2A is a vertical cross-section diagram of an interdigitated vertical native capacitor.
Figure 2B:
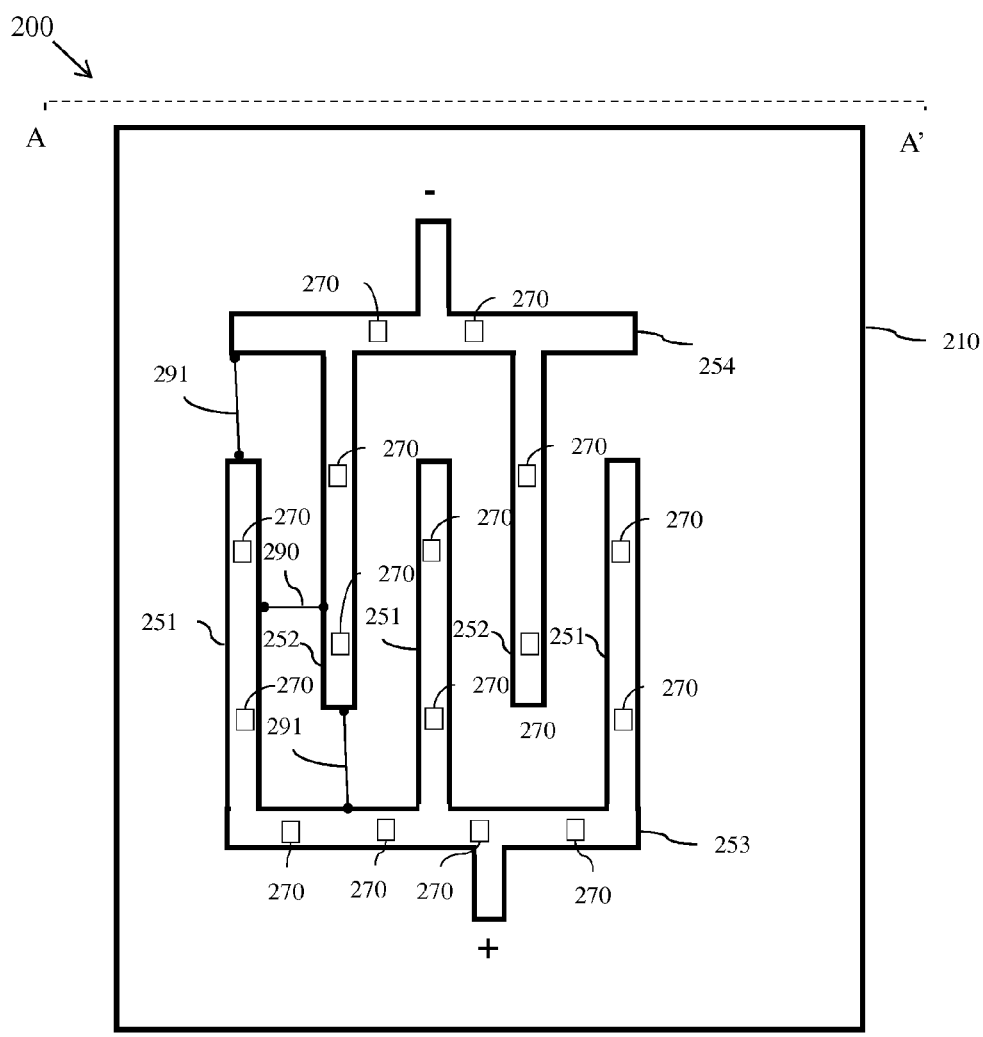
FIG. 2B is a horizontal cross-section diagram of the same interdigitated vertical native capacitor as shown in FIG. 2A.
Figure 2C:
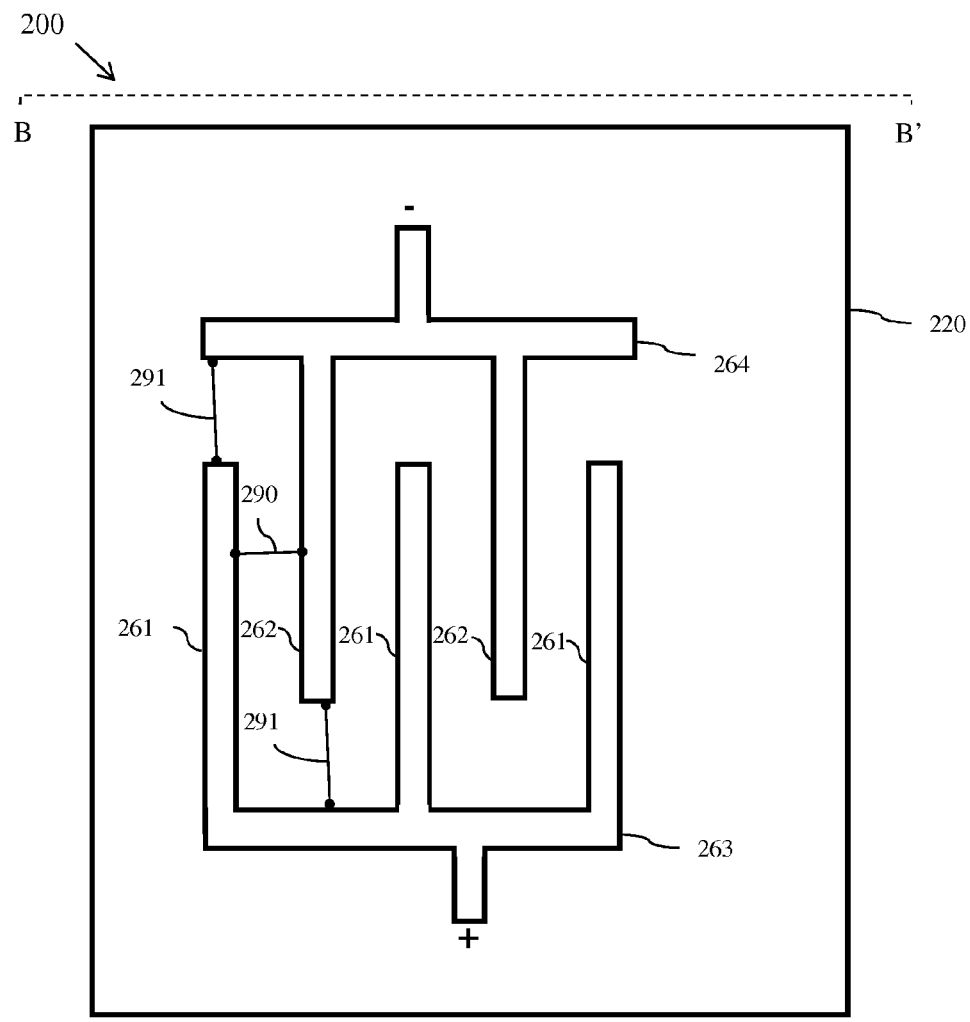
FIG. 2C is another horizontal cross-section diagram of the same interdigitated vertical native capacitor as shown in FIG. 2A.

More particularly, disclosed herein are a simple interdigitated capacitor 100 (also referred to herein and in the art as a "comb" type capacitor), which is shown in the vertical cross-section diagram of FIG. 1A and the horizontal cross-section diagram of FIG. 1B, and an interdigitated vertical native capacitor 200 (also referred to herein and in the art as a "comb" type vertical native capacitor), which is shown in the vertical cross-section diagram of FIG. 2A and the horizontal cross-section diagrams of FIGS. 2B and 2C.

Referring to FIGS. 1A-1B and FIGS. 2A-2C in combination, the simple interdigitated capacitor 100 and the interdigitated vertical native capacitor 200, respectively, can each comprise back end of the line (BEOL) capacitors formed in one or more of the BEOL metal level(s) (e.g., M1, M2, etc.) above a substrate 101, 201. The substrate 101, 201 can comprise, for example, a semiconductor substrate and this semiconductor substrate can comprise one or more active semiconductor devices covered by one or more dielectric layers and interconnected by interconnects within the BEOL metal levels (not shown).

The capacitors 100, 200 can each comprise a first dielectric layer 110, 210. This first dielectric layer 110, 210 can be at the M1 BEOL metal level, as shown. Alternatively, this first dielectric layer 110, 210 can be at a higher BEOL metal level (e.g., M2, M3, etc.). In any case, the first dielectric layer 110, 210 can have a top surface 115, 215 and a first coefficient of capacitance with respect to a specific parameter. For example, the first dielectric layer 110, 210 can have a first linear temperature coefficient of capacitance ($1^{st}$ $T_{cc}$), as discussed above with regard to the expression (1). Alternatively, the first dielectric layer 110, 210 can have a first quadratic voltage coefficient of capacitance ($1^{st}$ $V_{cc2}$)), as discussed above with regard to the expression (2). See detailed discussion below regarding the polarity and magnitude of the first coefficient of capacitance and the selection of a first dielectric material and a first thickness 111, 211 for the first dielectric layer 110, 210 in order to achieve the desired first coefficient of capacitance.

First metal wires 151, 251 (e.g., positively biased metal wires) and second metal wires 152, 252 (e.g., negatively biased metal wires) can be in the first dielectric layer 110, 210 at the top surface 115, 215. The first metal wires 151, 251 and second metal wires 152, 252 can be interdigitated and electrically isolated from each other by the first dielectric layer 110, 210. That is, each of the first metal wires 151, 251 can be arranged in parallel and can be electrically connected at one end by a first connecting wire 153, 253, thereby creating a first comb shape. Similarly, each of the second metal wires 152, 252 can be arranged in parallel and can be electrically connected at the opposite end by a second connecting wire 154, 254, thereby creating a second comb shape. The first and second comb shapes can be positioned opposite each other such that the first metal wires 151, 251 and second metal wires 152, 252 are interdigitated. That is, the first and second comb shapes can be positioned opposite each other such that the first metal wires 151, 251 and second metal wires 152, 252 are alternating with each first metal wire 151, 251 being positioned laterally adjacent to and parallel to at least one second metal wire 152, 252. The pitch between the alternating first metal wires 151, 251 and second metal wires 152, 252 can be uniform.

The first metal wires 151, 251 and second metal wires 152, 252 can each comprise, for example, damascene structures comprising wire trenches that extend vertically into the dielectric layer 110, 210 from the top surface 115, 215. Optionally, the wire trenches can be lined with a thin conductive diffusion barrier layer (not shown). This conductive diffusion barrier layer can comprise, for example, a cobalt layer, a chromium layer, a ruthenium layer, a tantalum layer, a tantalum nitride layer, an indium oxide layer, a tungsten layer, a tungsten nitride layer, a titanium layer, a titanium nitride layer, etc. The wire trenches can further be filled with metal wire layer (e.g., copper (Cu) layer, aluminum (Al) layer or any other suitable metal or metal alloy wire layer).

A second dielectric layer 120, 220 can be positioned on the top surface 115, 215 of the first dielectric layer 110, 210 such that it extends laterally over and, particularly, covers the first metal wires 151, 251 and the second metal wires 152, 252. This second dielectric layer 120, 220 can have a second coefficient of capacitance with respect to the specific parameter. For example, the second dielectric layer 120, 220 can have a second linear temperature coefficient of capacitance ($2^{nd}$ $T_{cc}$), as discussed above with regard to the expression (1). Alternatively, the second dielectric layer 120, 220 can have a second quadratic voltage coefficient of capacitance ($2^{nd}$ $V_{cc2}$)), as discussed above with regard to the expression (2). See detailed discussion below regarding the polarity and magnitude of the second coefficient of capacitance and the selection of a second dielectric material and a second thickness 121, 221 for the second dielectric layer 120, 220 in order to achieve the desired second coefficient of capacitance.

It should be noted that for an interdigitated vertical native capacitor 200, as shown in FIGS. 2A-2C, additional first metal wires 261 (e.g., additional positively biased metal wires) and additional second metal wires 262 (e.g., additional negatively biased wires) can further be positioned in the second dielectric layer 220. The additional first metal wires 261 can be interdigitated with and electrically isolated from the additional second wires 262. That is, each of the additional first metal wires 261 can be arranged in parallel and can be electrically connected at one end by an additional first connecting wire 263, thereby creating an additional first comb shape. Similarly, each of the additional second metal wires 262 can be arranged in parallel and can be electrically connected at the opposite end by an additional second connecting wire 264, thereby creating a second comb shape. The additional first and second comb shapes can be positioned opposite each other such that the additional first metal wires 261 and additional second metal wires 262 are interdigitated. The pitch between these wires can be uniform.

Furthermore, the additional first metal wires 261 can be aligned above and electrically connected to the first metal wires 251 in the first dielectric layer 210 (e.g., by vias 270). Similarly, the additional second metal wires 262 can be aligned above and electrically connected to the second metal wires 252 in the first dielectric layer 210 (e.g., also by vias 270). The additional first metal wires 261 and additional second metal wires 262 as well as the vias 270 that connect them to the first metal wires 251 and second metal wires 252, respectively, can comprise, for example, dual damascene structures. These dual damascene structures can comprise upper tier wire trenches that extend vertically into the second dielectric layer 220 from the top surface 225 and lower tier via openings that extend vertically from the wire trenches to the wires 251, 252 below. Optionally, the wire trenches and via openings can be lined with a thin conductive diffusion barrier layer (not shown). This conductive diffusion barrier layer can comprise, for example, a cobalt layer, a chromium layer, a ruthenium layer, a tantalum layer, a tantalum nitride layer, an indium oxide layer, a tungsten layer, a tungsten nitride layer, a titanium layer, a titanium nitride layer, etc. The wire trenches and via openings can further be filled with metal wire layer (e.g., copper (Cu) layer, aluminum (Al) layer or any other suitable metal or metal alloy wire layer).

In any case (i.e., whether the capacitor is a simple interdigitated capacitor 100 as shown in FIGS. 1A-1B or an interdigitated vertical native capacitor 200, as shown in FIGS. 2A-2C), the second coefficient of capacitance of the second dielectric layer 120, 220 (e.g., the second linear temperature coefficient of capacitance ($2^{nd}\ T_{cc}$) or the second quadratic voltage coefficient of capacitance ($2^{nd}\ V_{cc2}$), as applicable) can be different from the first coefficient of capacitance of the first dielectric layer 110, 210. Specifically, the first coefficient of capacitance of the first dielectric layer 110, 210 and the second coefficient of capacitance of the second dielectric layer 120, 220 can have opposite polarities and can further be approximately equal in magnitude such that the capacitor (be it a simple interdigitated capacitor 100, as shown in FIGS. 1A-1B or an interdigitated vertical native capacitor 200, as shown in FIGS. 2A-2C) has a specific net coefficient of capacitance of approximately zero with respect to the specific parameter.

Figure 3:
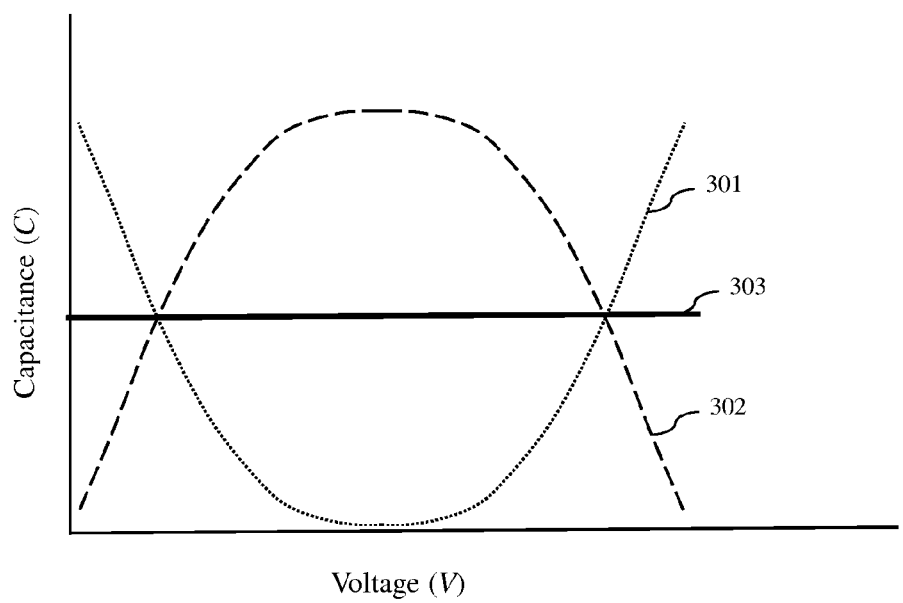
FIG. 3 is an exemplary capacitance to voltage graph.

For example, as shown in the capacitance to voltage graph of FIG. 3, a first quadratic voltage coefficient of capacitance ($1^{st}\ V_{cc2}$) of the first dielectric layer 110, 210, as illustrated by the first capacitance to voltage curve 301, and a second quadratic voltage coefficient of capacitance ($2^{nd}\ V_{cc2}$) of the second dielectric layer 120, 220, as illustrated by the capacitance to voltage curve 302, which have opposite polarities and further which are approximately equal in magnitude. The impact of these two different coefficients of capacitance will cancel each other out such that the capacitor will have an approximately zero net quadratic voltage coefficient of capacitance (zero net $V_{cc2}$), as illustrated by the capacitance to voltage curve 303.

It should be noted that, in the capacitors 100 and 200 described above and illustrated in FIGS. 1A-B and 2A-C, the specifications for the first dielectric layer 110, 210 and the second dielectric layer 120, 220 and, particularly, the ratio between the first thickness 111, 211 of the first dielectric layer 110, 210 and the second thickness 121, 221 of the second dielectric layer 120, 220 can be predefined, as described in greater detail below with regard to the method embodiments, based on both the applicable coefficient of capacitance values for each of the different dielectric materials used (e.g., the quadratic voltage coefficient of capacitance $V_{cc2}$ values or the linear temperature coefficient of capacitance $T_{cc}$ values for each of the different dielectric materials used) and the spacing 190, 290 between the first metal wires 151, 251 and the second metal wires 152, 252 (and, if applicable, the spacing between the additional first metal wires 261 and the additional second metal wires 262 in the case of the interdigitated vertical native capacitor 200) in order to achieve a zero net coefficient of capacitance (i.e., a zero net $V_{cc2}$ or a zero net $T_{cc}$). It should be noted that the any additional wire spacings (e.g., wire spacings 191, 291 between the connecting wires of one comb-shaped structure and the metal wires on the opposite comb-shaped structure) should be greater than the spacing 190, 290 between adjacent metal wires and, particularly, should be sufficient great so as to avoid the occurrence of a capacitor breakdown mechanism anywhere other than between the interdigitated metal wires.

For example, silicon oxide ($SiO_2$) has a negative quadratic voltage coefficient of capacitance (i.e., $-V_{cc2}$) and silicon nitride ($Si_3N_4$) and aluminum oxide ($Al_2O_3$) each have positive quadratic voltage coefficients of capacitance (i.e., $+V_{cc2}$). In the simple interdigitated capacitor 100 of FIGS. 1A-1B or the interdigitated vertical native capacitor 200 of FIGS. 2A-2C, if the first dielectric layer 110, 210 comprises a silicon oxide ($SiO_2$) layer and the second dielectric layer 120 comprises a silicon nitride ($Si_3N_4$) layer, then the ratio of the first thickness 111, 211 to the second thickness 121, 221 can be as follows: 1:1.7 when the metal wire spacing 190, 290 is 100 nm, 1:1.2 when the metal wire spacing 190, 290 is 300 nm, or 1:1 when the metal wire spacing is 500 nm. However, in the same simple interdigitated capacitor 100 of FIGS. 1A-1B or the same interdigitated vertical native capacitor 200 of FIGS. 2A-2C, if the first dielectric layer 110, 210 comprises a silicon oxide ($SiO_2$) layer and the second dielectric layer 120 comprises an aluminum oxide ($Al_2O_3$) layer, then the ratio of the first thickness 111, 211 to the second thickness 121, 221 can be as follows: 20:1 when the metal wire spacing 190, 290 is 100 nm, 43:1 when the metal wire spacing 190, 290 is 300 nm, or 66:1 when the metal wire spacing is 500 nm. In any case, as a result, the negative $1^{st}\ V_{cc2}$ of the first dielectric layer 110, 210 will be approximately equal in magnitude to the positive $2^{nd}\ V_{cc2}$ of the second dielectric layer 120, 220 so that the capacitor 100, 200 has a zero net $V_{cc2}$.

It should further be noted that factors such as processing feasibility and/or impact on other on-chip components may make it impractical and/or impossible to form a capacitor, as describe above, that comprises a first dielectric layer having the desired first thickness to achieve the desired first coefficient of capacitance and/or a second dielectric layer having the desired second thickness to achieve the desired second coefficient of capacitance. As a result, the net coefficient of capacitance with respect to the specific parameter may be slightly above or below zero. In this case, a third dielectric layer 130, 230 can be incorporated into either the simple interdigitated capacitor 100 or the interdigitated vertical native capacitor 200 in order to fine tune the net coefficient of capacitance toward zero. That is, a third dielectric layer 130, 230 can be incorporated into the capacitor 100 or 200. This third dielectric layer 130, 230 can comprise a third dielectric material and can have a third thickness 131, 231 such that it has a third coefficient of capacitance with respect to the specific parameter (e.g., a third linear temperature coefficient of capacitance or a third quadratic voltage coefficient of capacitance, as applicable). The third dielectric material and third thickness 131, 231 of the third dielectric layer 130, 230 can be predefined such that the third coefficient of capacitance has the same polarity as the first coefficient of capacitance, when the magnitude of the first coefficient of capacitance is less than that of the second, in order to make up for the difference (i.e., in order to move the net coefficient of capacitance toward zero). Alternatively, the third dielectric material and third thickness 131, 231 of the third dielectric layer 130, 230 can be predefined such that the third coefficient of capacitance has the same polarity as the second coefficient of capacitance, when the magnitude of the second coefficient of capacitance is less than that of the first, in order to make up for the difference (i.e., in order to move the net coefficient of capacitance toward zero).

Figure 4A:
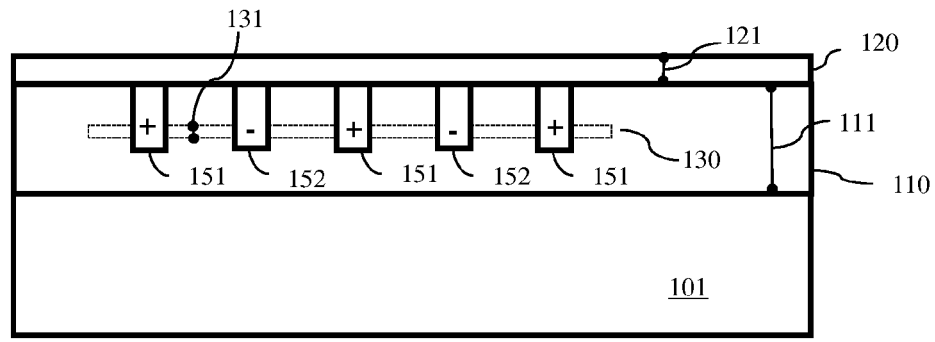
FIG. 4A is a vertical cross-section diagram of an alternative embodiment of a simple interdigitated capacitor.
Figure 4B:
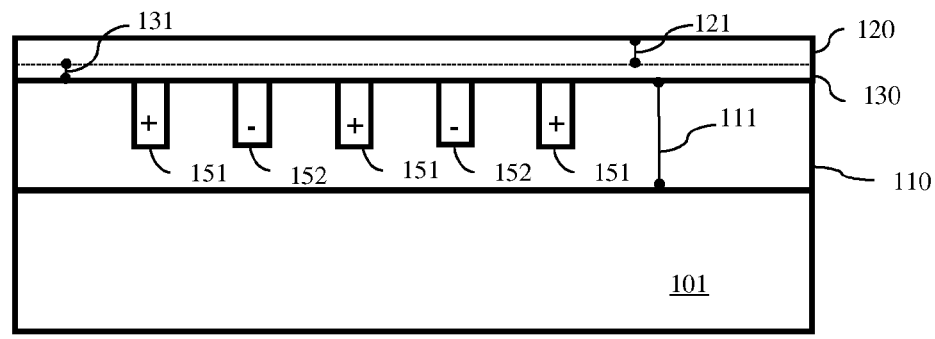
FIG. 4B is a vertical cross-section diagram of another embodiment of a simple interdigitated capacitor.
Figure 4C:
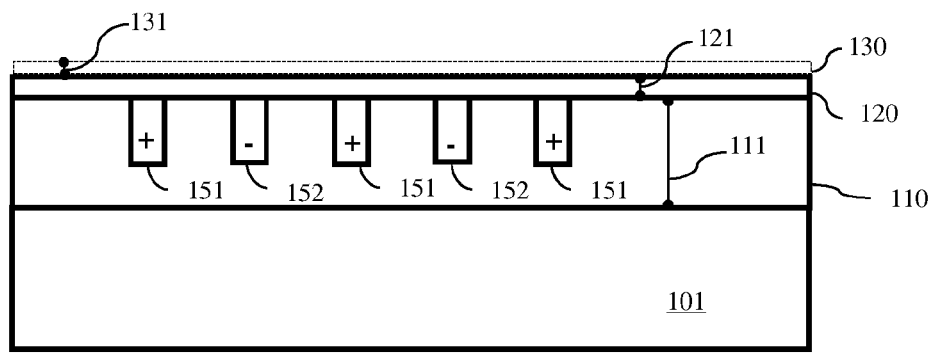
FIG. 4C is a vertical cross-section diagram of yet another embodiment of a simple interdigitated capacitor.

For example, with regard to the simple interdigitated capacitor 100 of FIG. 1A, in one exemplary embodiment, a third dielectric layer 130 can be positioned within the first dielectric layer 110 such that the first metal wires 151 and the second metal wires 152 extend vertically through the third dielectric layer (see FIG. 4A). In this case, the first dielectric layer 110, the second dielectric layer 120 and the third dielectric layer 130 can comprise three different dielectric materials (e.g., silicon oxide ($SiO_2$), silicon nitride ($Si_3N_4$) and aluminum oxide ($Al_2O_3$), respectively). Alternatively, the second dielectric layer 120 and the third dielectric layer 130 can comprise the same dielectric material (e.g., silicon nitride ($Si_3N_4$) or aluminum oxide ($Al_2O_3$)) and the first dielectric layer 110 can comprise a different dielectric material (e.g., silicon oxide ($SiO_2$)). In other exemplary embodiments, a third dielectric layer 130 can be stacked between the first dielectric layer 110 and the second dielectric layer 120 (see FIG. 4B) or stacked above the second dielectric layer 120 (see FIG. 4C). In these cases, the first dielectric layer 110, the second dielectric layer 120 and the third dielectric layer 130 can again comprise three different dielectric materials (e.g., silicon oxide ($SiO_2$), silicon nitride ($Si_3N_4$) and aluminum oxide ($Al_2O_3$), respectively).

Figure 5A:
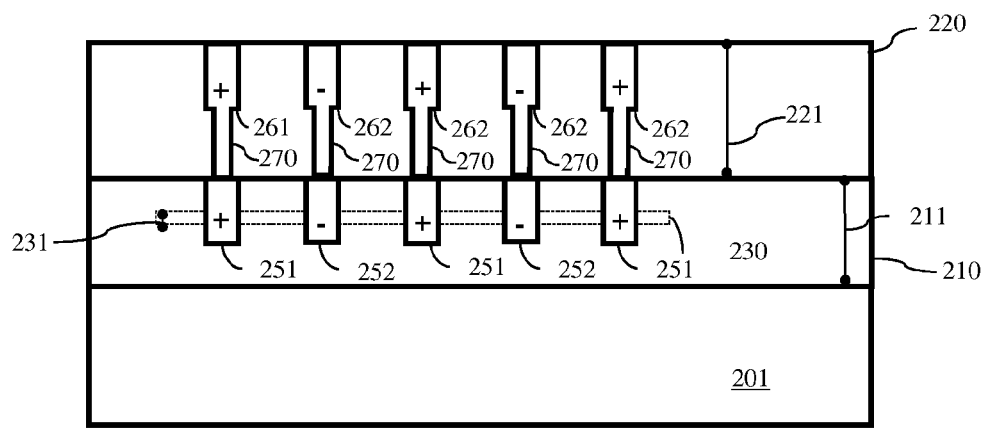
FIG. 5A is a vertical cross-section diagram of an alternative embodiment of a vertical native interdigitated capacitor.
Figure 5B:
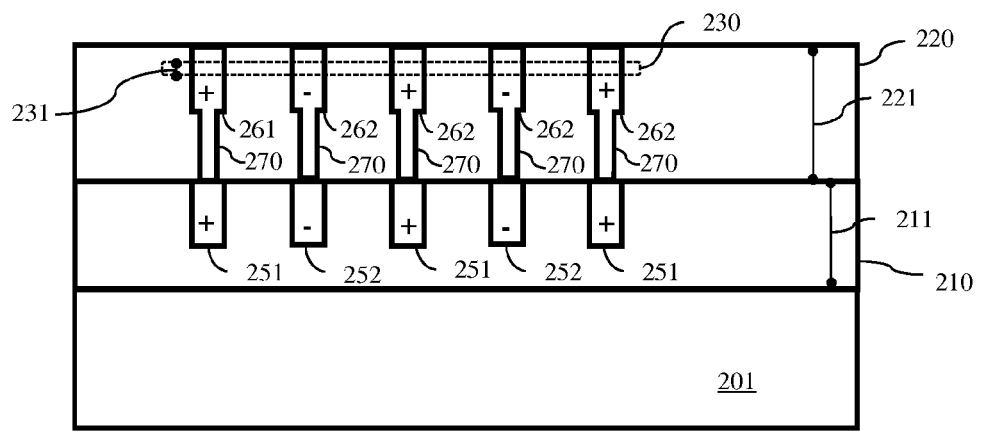
FIG. 5B is a vertical cross-section diagram of another embodiment of a vertical native interdigitated capacitor.
Figure 5C:
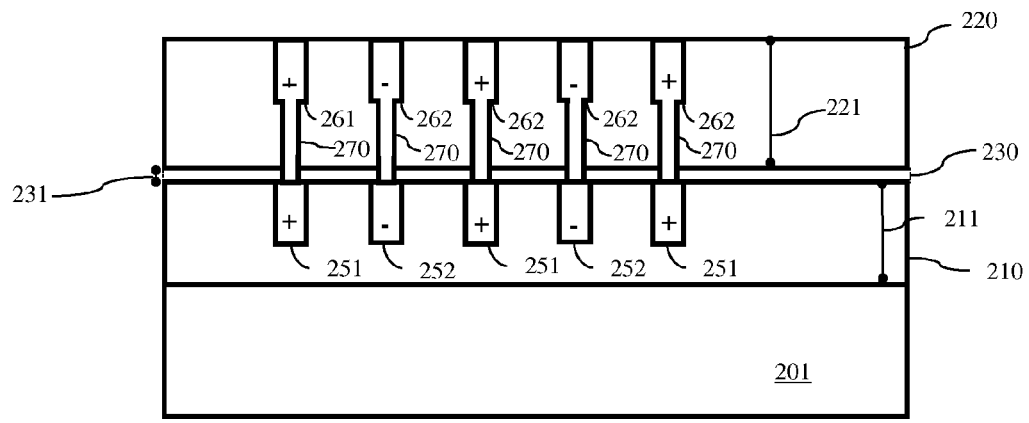
FIG. 5C is a vertical cross-section diagram of yet another embodiment of a vertical native interdigitated capacitor.
Figure 5D:
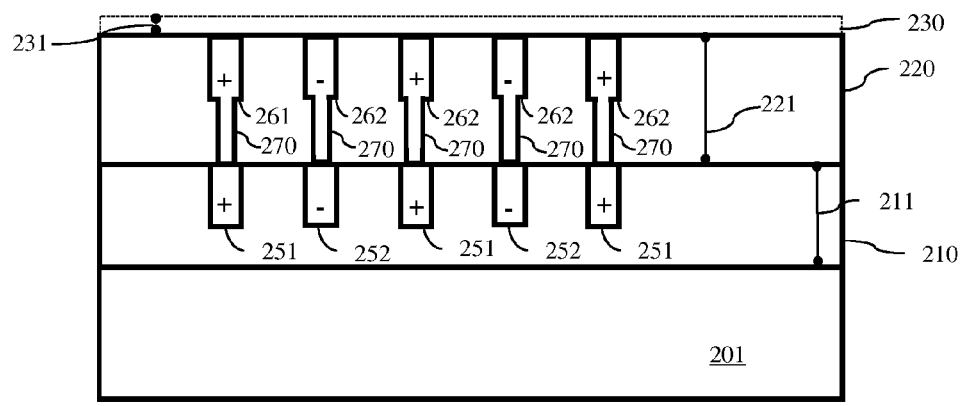
FIG. 5D is a vertical cross-section diagram of yet another embodiment of a vertical native interdigitated capacitor.

Similarly, with regard to the interdigitated vertical native capacitor 200 of FIG. 2A, in one exemplary embodiment, a third dielectric layer 230 can be positioned within the first dielectric layer 210 such that the first metal wires 251 and the second metal wires 252 extend vertically through the third dielectric layer (see FIG. 5A) or, alternatively, within the second dielectric layer 220 such that the additional first metal wires 261 and the additional second metal wires 262 and/or the vias 270 extend vertically through the third dielectric layer (see FIG. 5B). In this case, the first dielectric layer 210, the second dielectric layer 220 and the third dielectric layer 230 can comprise three different dielectric materials (e.g., silicon oxide (SiO2), silicon nitride ($Si_3N_4$) and aluminum oxide ($Al_2O_3$), respectively). Alternatively, if the third dielectric layer 230 is within the first dielectric layer 210, the second dielectric layer 220 and the third dielectric layer 230 can comprise the same dielectric material (e.g., silicon nitride ($Si_3N_4$) or aluminum oxide ($Al_2O_3$)) and the first dielectric layer 210 can comprise a different dielectric material (e.g., silicon oxide ($SiO_2$)). In other exemplary embodiments, a third dielectric layer 230 can be stacked between the first dielectric layer 210 and the second dielectric layer 220 (see FIG. 5C) or stacked above the second dielectric layer 220 (see FIG. 5D). In these cases, the first dielectric layer 210, the second dielectric layer 220 and the third dielectric layer 230 can again comprise three different dielectric materials (e.g., silicon oxide (SiO2), silicon nitride ($Si_3N_4$) and aluminum oxide ($Al_2O_3$), respectively).

In this case, the ratio between the first thickness 111, 211 of the first dielectric layer 110, 210, the second thickness 121, 221 of the second dielectric layer 120, 220 and the third thickness of the third dielectric layer 130, 230 can similarly predefined based on both applicable coefficient of capacitance values for each of the different dielectric materials used (e.g., the quadratic voltage coefficient of capacitance $V_{cc2}$ values or the linear temperature coefficient of capacitance $T_{cc}$ values of the different dielectric materials used) and the metal wire spacing 190, 290 in order to achieve the desired zero net $V_{cc2}$.

Figure 6:
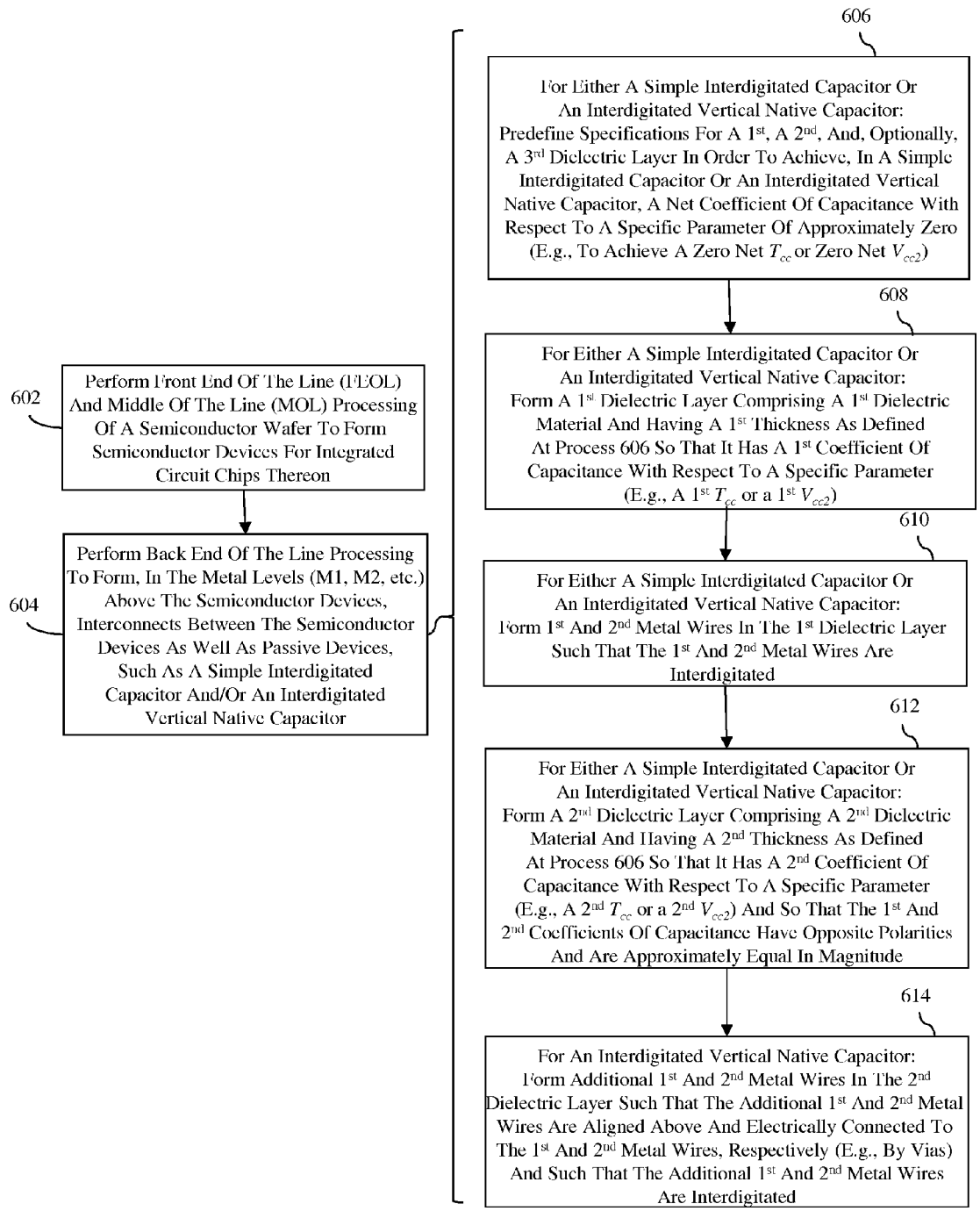
FIG. 6 is a flow diagram illustrating methods of forming interdigitated capacitors.
Figure 7:
FIG. 7 is a vertical cross-section diagram illustrating a partially completed interdigitated capacitor formed according to the methods of FIG. 6.

Referring to FIG. 6, also disclosed herein are methods of forming the simple interdigitated capacitor 100 of FIGS. 1A-1B and the interdigitated vertical native capacitor 200 of FIGS. 2A-2C, as described above. To form either of these capacitors 100, 200, front end of the line (FEOL) and middle of the line (MOL) processing of a semiconductor wafer can be performed in order to form semiconductor devices thereon (602). Next, one or more dielectric layers (e.g., a borophosphosilicate glass (BPSG) layer, a silicon oxide ($SiO_2$) layer, etc.) can be deposited over the semiconductor devices and back end of the line (BEOL) processing can be performed in order to form, in BEOL metal levels (e.g., in M1, M2 and so on) above the dielectric layer(s), interconnects between the semiconductor devices as well as any passive devices including, but not limited to, the simple interdigitated capacitor 100 or the interdigitated vertical native capacitor 200 (604).

Specifically, at process 604, specifications for a first dielectric layer, a second dielectric layer and, optionally, a third dielectric layer can be predefined in order to achieve, in either a simple interdigitated capacitor 100, as shown in FIGS. 1A-1B or an interdigitated vertical native capacitor 200, as shown in FIGS. 2A-2C, a specific net coefficient of capacitance with regard to the specific parameter of approximately zero (e.g., in order to achieve a net linear temperature coefficient of capacitance of approximately zero (zero net $T_{cc}$) or a net quadratic voltage coefficient of capacitance of approximately zero (zero net $V_{cc2}$)) (606). The specifications can include a first dielectric material and a first thickness for the first dielectric layer, a second dielectric material and a second thickness for the second dielectric layer, and so on (see more detailed discussion below).

Figure 8A:
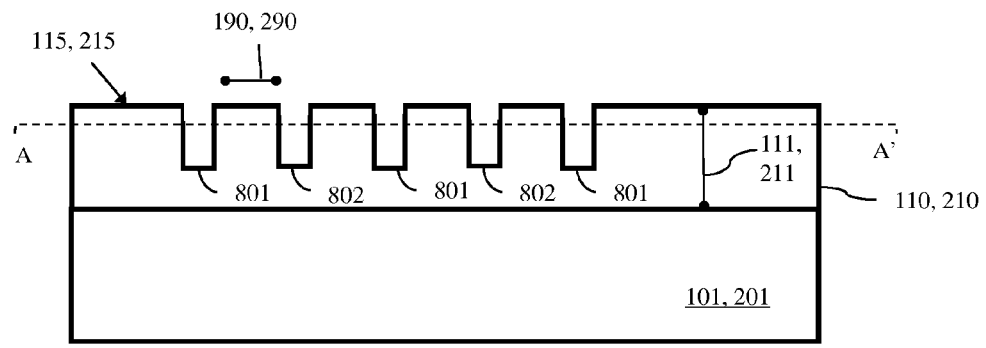
FIG. 8A is a vertical cross-section diagram illustrating a partially completed interdigitated capacitor formed according to the methods of FIG. 6.
Figure 8B:
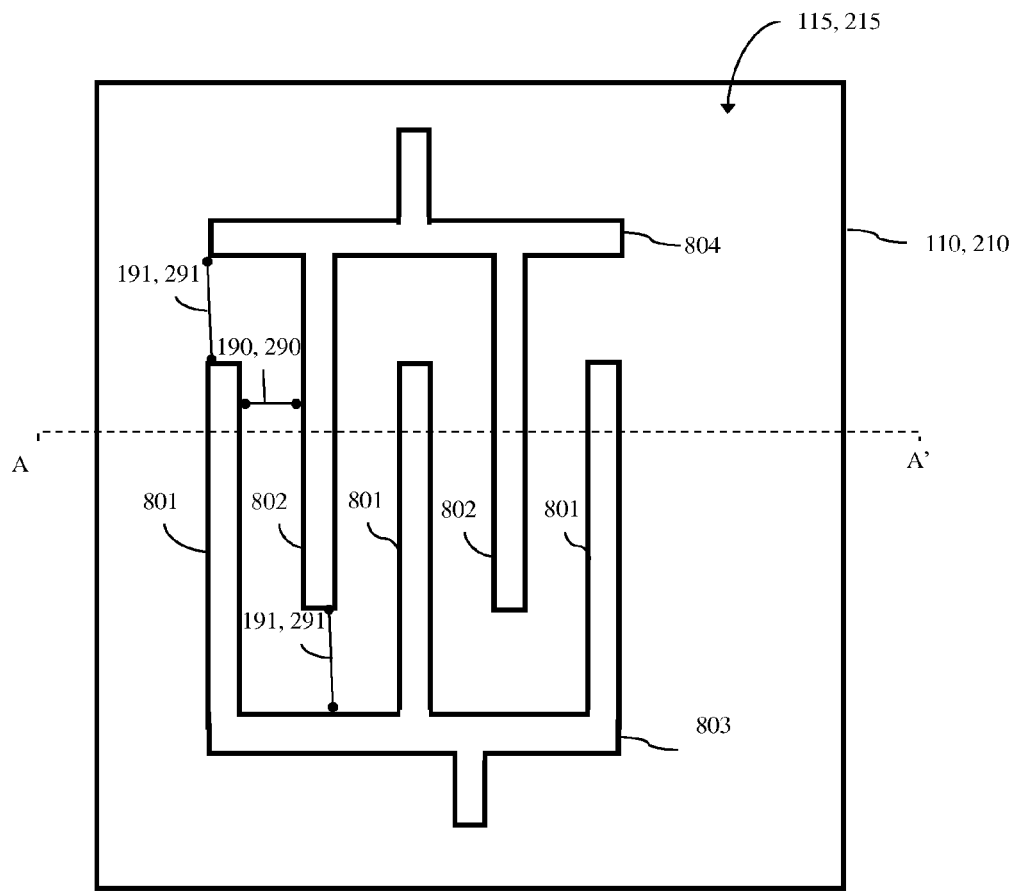
FIG. 8B is a horizontal cross-section diagram of the same partially completed interdigitated capacitor as shown in FIG. 8A.

Next, the simple interdigitated capacitor 100 or the interdigitated vertical native capacitor 200, as applicable, can be formed according to the specifications defined at process 606. Specifically, to form either the simple interdigitated capacitor 100 or the interdigitated vertical native capacitor 200, a first dielectric layer 110, 210 can be formed (e.g., deposited and planarized, if necessary) over the substrate 101, 201 such that it comprises a first dielectric material and has a first thickness 111, 211, as predefined at process 606, and, thereby such that it has a first coefficient of capacitance with respect to a specific parameter (e.g., a first linear temperature coefficient of capacitance ($1^{st} T_{cc}$) or a first quadratic voltage coefficient of capacitance ($1^{st} V_{cc2}$)) (608, see FIG. 8). It should be noted that this first dielectric layer 110, 210 can be formed at the M1 BEOL metal level, as shown. Alternatively, this first dielectric layer 110, 210 can be formed at a higher BEOL metal level (e.g., M2, M3, etc.).

Then, first metal wires (which, in the final structure, will be positively biased metal wires) and second metal wires (which, in the final structure, will be negatively biased metal wires) can be formed in the first dielectric layer 110, 210 at the top surface 115, 215 (610). Specifically, using conventional damascene processing techniques, wire trenches 801-804 can be lithographically patterned and etched such that they extend vertically into the dielectric layer 110, 210 from the top surface 115, 215 and such that they have the desired spacing 190, 290 (see FIGS. 8A and 8B). That is, first wire trenches 801 for first metal wires can be patterned and etched such that they are arranged in parallel and such that they are connected at one end to another wire trench 803 for a first connecting wire, thereby creating a first comb shape. Similarly, second wire trenches 802 for second metal wires can be patterned and etched such that they are arranged in parallel and such that they are connected at one opposite end to another wire trench 804 for a second connecting wire, thereby creating a second comb shape. The first and second comb shapes can further be patterned and etched such that they are opposite each other and such that the first wire trenches 801 and second wire trenches 802 are interdigitated. That is, the first and second comb shapes can be patterned and etched such that they are positioned opposite each other and such that the first wire trenches 801 and second wire trenches 802 are alternating with each first wire trench 801 being positioned laterally adjacent to and parallel to at least one second wire trench 802. The first wire trenches 801 and the second wire trenches 802 can have the same width and the spacing 190, 290 between alternating first wire trenches 801 and second wire trenches 802 can be uniform such that the pitch between the alternating first wire trenches 801 and second wire trenches 802 is also uniform.

Figure 9A:
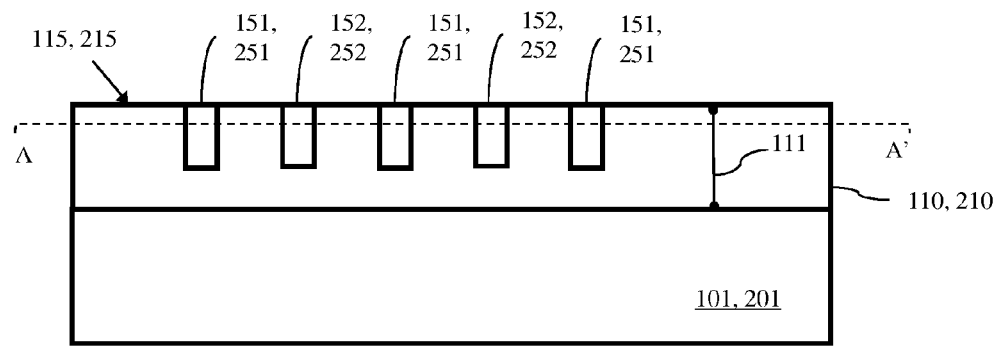
FIG. 9A is a vertical cross-section diagram illustrating a partially completed interdigitated capacitor formed according to the methods of FIG. 6.
Figure 9B:
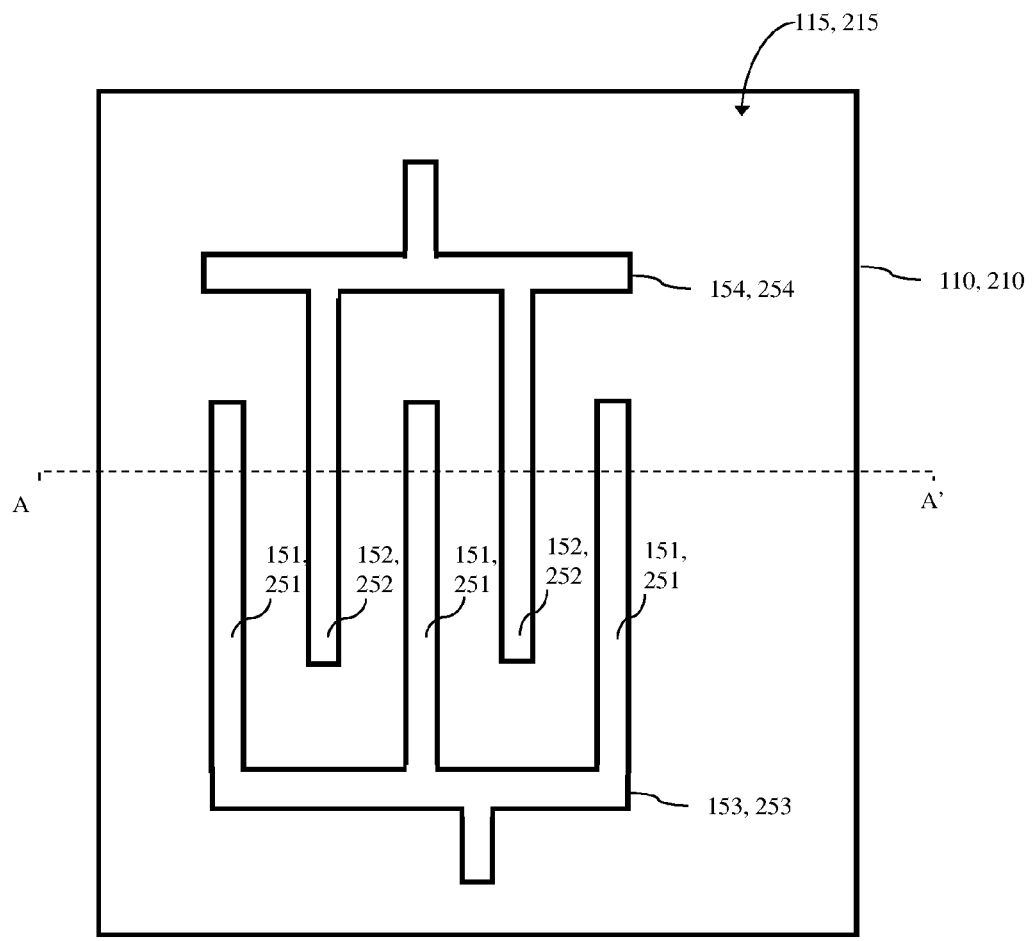
FIG. 9B is a horizontal cross-section diagram of the same partially completed interdigitated capacitor as shown in FIG. 9A.

Optionally, the wire trenches 801-804 can then be lined with a thin conductive diffusion barrier layer (not shown). This conductive diffusion barrier layer can comprise, for example, a cobalt layer, a chromium layer, a ruthenium layer, a tantalum layer, a tantalum nitride layer, an indium oxide layer, a tungsten layer, a tungsten nitride layer, a titanium layer, a titanium nitride layer, etc. Next, a metal wire layer (e.g., copper (Cu) layer, aluminum (Al) layer or any other suitable metal or metal alloy wire layer) can be deposited (e.g., by electrodeposition or any other suitable deposition technique) so as to fill the wire trenches 801-804 and, thereby form the first metal wires 151, 251 and first connecting wire 153, 253 electrically connecting the first metal wires as well as the second metal wires 152, 252 and the second connecting wire 154, 254 electrically connecting the second metal wires 152, 252 (see FIGS. 9A and 9B). If necessary, a chemical mechanical polishing (CMP) process can be performed after metal wires formation to remove any metal wire material from the top surface 115, 215 of the first dielectric layer 110, 210.

Figure 10:
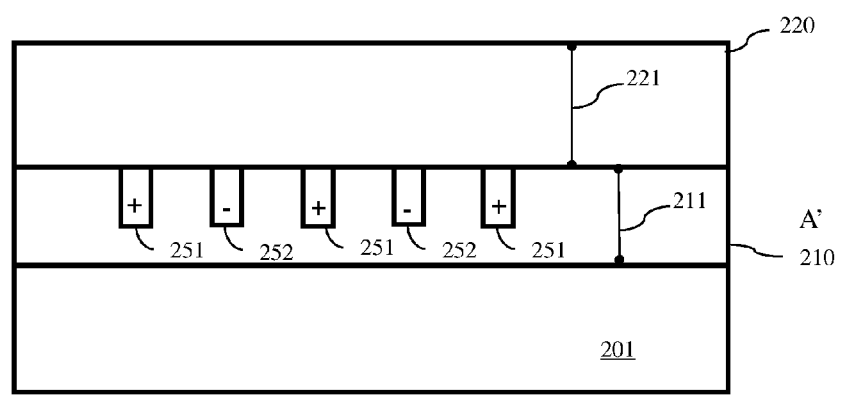
FIG. 10 is a vertical cross-section diagram illustrating specifically a partially completed vertical native interdigitated capacitor formed according to the methods of FIG. 6.

Next, a second dielectric layer can be formed (e.g., deposited) on the top surface 115, 215 of the first dielectric layer 110, 210 so as to extend laterally over and, particularly, so as to cover the first metal wires 151, 251 and the second metal wires 152, 252 (612). For a simple interdigitated capacitor 100, deposition of the second dielectric layer 120 at process 612 can be the final process step (see FIG. 1A), whereas, for the interdigitated vertical native capacitor, deposition of the second dielectric layer 220 at process 612 will be an intermediate process step (as shown in FIG. 10).

Figure 11A:
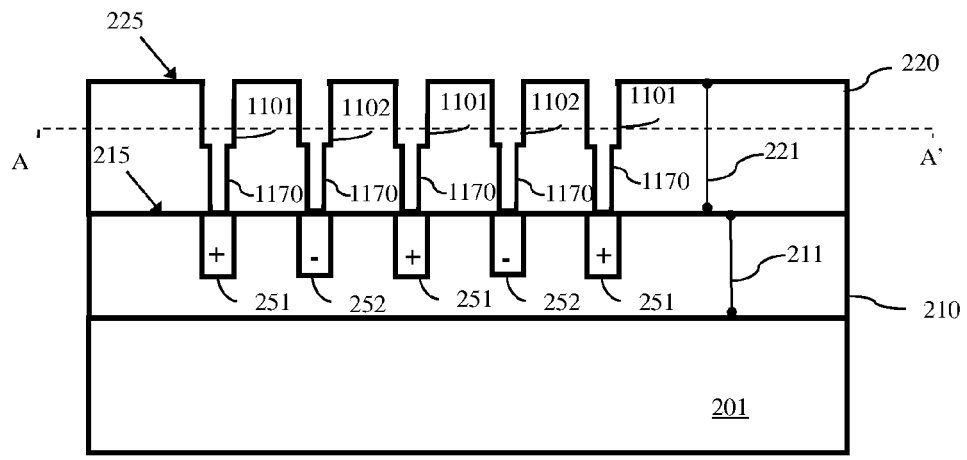
FIG. 11A is a vertical cross-section diagram illustrating a partially completed vertical native interdigitated capacitor formed according to the methods of FIG. 6.
Figure 11B:
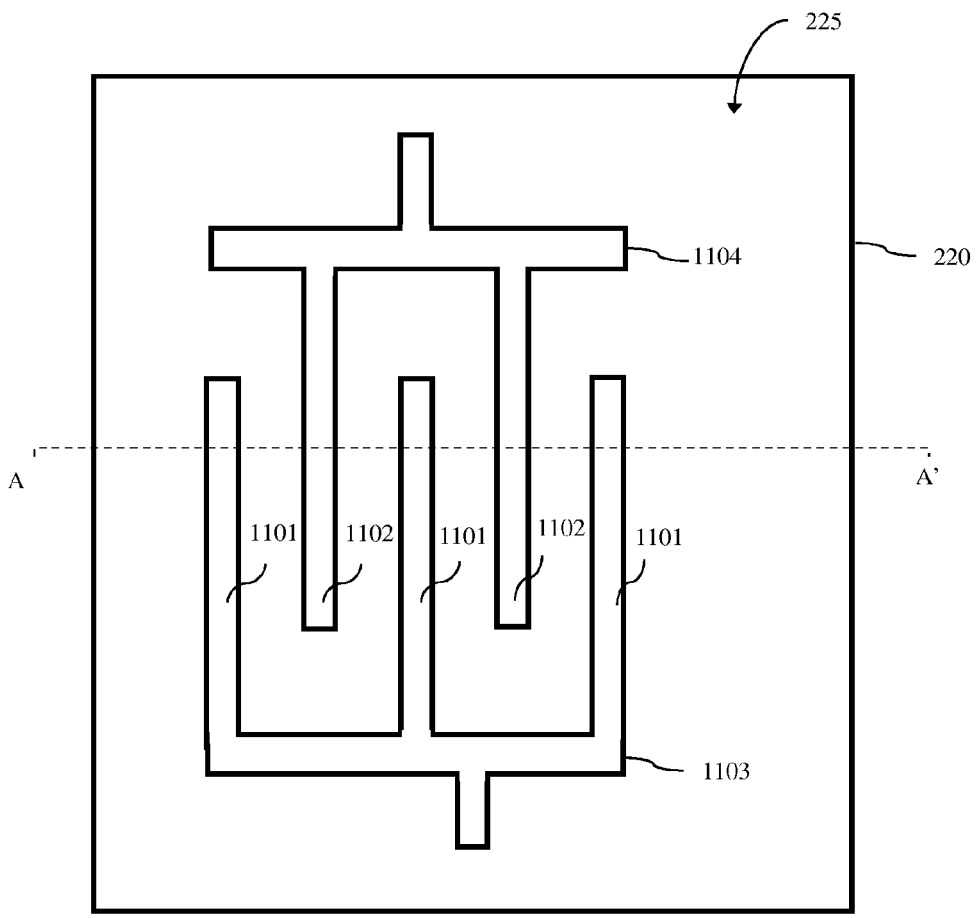
FIG. 11B is a horizontal cross-section diagram of the same partially completed vertical native interdigitated capacitor as shown in FIG. 11A.

For the interdigitated vertical native capacitor 200, the method can further comprise forming additional first metal wires and additional second metal wires in the second dielectric layer 220 at the top surface 225 (614). Specifically, using conventional dual damascene processing techniques, upper tier wire trenches 1101-1104, which extend vertically into the second dielectric layer 220 from the top surface 225, and lower tier via openings 1170, which extend vertically from the upper tier wire trenches 1101-1104 to the wires 251, 252 below, can be lithographically patterned and etched (see FIGS. 11A-11B). That is, first upper tier wire trenches 1101 for additional first metal wires can be patterned and etched such that they are arranged in parallel, such that they are connected at one end to another upper tier wire trench 1103 for an additional first connecting wire in an additional first comb shape, and such that they are aligned above the first metal wires 251 below. Additionally, lower tier via openings 1170 can be patterned and etched such that they extend vertically between the first upper tier wire trenches 1101 and the first metal wires 251 below. Similarly, second upper tier wire trenches for additional second metal wires can be patterned and etched such that they are arranged in parallel, such that they are connected at one end to another upper tier wire trench 1104 for an additional second connecting wire in an additional second comb shape, and such that they are aligned above the second metal wires 252 below. Additionally, lower tier via openings 1170 can also be patterned and etched such that they extend vertically between the second upper tier wire trenches 1102 and the second metal wires 252 below. The additional first and second comb shapes can further be patterned and etched such that they are opposite each other and such that the additional first wire trenches 1101 and second wire trenches 1102 are interdigitated. That is, the additional first and second comb shapes can be patterned and etched such that they are positioned opposite each other and such that the additional first wire trenches 1101 and additional second wire trenches 1102 are alternating with each additional first wire trench 1101 being positioned laterally adjacent to and parallel to at least one additional second wire trench 1102. The pitch between the alternating additional first wire trenches 1101 and additional second wire trenches 1102 can be uniform.

Optionally, the additional wire trenches 1101-1104 and via openings 1170 can be lined with a thin conductive diffusion barrier layer (not shown). This conductive diffusion barrier layer can comprise, for example, a cobalt layer, a chromium layer, a ruthenium layer, a tantalum layer, a tantalum nitride layer, an indium oxide layer, a tungsten layer, a tungsten nitride layer, a titanium layer, a titanium nitride layer, etc. Next, a metal wire layer (e.g., copper (Cu) layer, aluminum (Al) layer or any other suitable metal or metal alloy wire layer) can be deposited (e.g., by electrodeposition or any other suitable deposition technique) so as to fill the additional wire trenches 1101-1104 and via openings 1170 and, thereby form the additional first metal wires 261, the additional first connecting wire 263 electrically connecting the additional first metal wires 261, the additional second metal wires 262 and the additional second connecting wire 264 electrically connecting the additional second metal wires 262, and the vias 270 to the first metal wires 251 and second metal wires 252 below (see FIGS. 2A-2C). If necessary, a chemical mechanical polishing (CMP) process can be performed after metal wires formation to remove any metal wire material from the top surface 225 of the second dielectric layer 220.

In any case, the second dielectric layer 120 (as shown in FIG. 1A) or 220 (as shown in FIG. 2A) can be formed (e.g., deposited and planarized, as necessary) at process 612 such that it comprises a second dielectric material and has a second thickness 121, 221, as predefined at process 606, and, thereby such that it has a second coefficient of capacitance with respect to a specific parameter (e.g., a second linear temperature coefficient of capacitance ($2^{nd}\ T_{cc}$) or a second quadratic voltage coefficient of capacitance ($2^{nd}\ V_{cc2}$)). The second coefficient of capacitance shall be different from the first coefficient of capacitance. Specifically, the process 606 of predefining of the specifications for the dielectric layers 110, 210 can be performed such that the first coefficient of capacitance of the first dielectric layer 110, 210 and the second coefficient of capacitance of the second dielectric layer 120, 220 will have opposite polarities, but will be approximately equal in magnitude, and, thus, such that the capacitor (be it a simple interdigitated capacitor 100 or an interdigitated vertical native capacitor 200) will have a specific net coefficient of capacitance with respect to the specific parameter of approximately zero (e.g., an approximately zero net linear temperature coefficient of capacitance (zero net $T_{cc}$) or an approximately zero net quadratic voltage coefficient of capacitance (zero net $V_{cc2}$), as applicable).

More specifically, at process 606, the specifications for the first dielectric layer 110, 210 and the second dielectric layer 120, 220 and, particularly, the ratio between the first thickness 111, 211 of the first dielectric layer 110, 210 and the second thickness 121, 221 of the second dielectric layer 120, 220 of a capacitor 100, 200 as described above and illustrated in FIGS. 1A-B and 2A-C, can be predefined based on both the applicable coefficient of capacitance values for each of the different dielectric materials selected to be used and the desired spacing 190, 290 between the first metal wires 151, 251 and the second metal wires 152, 252 (and, if applicable, the spacing between the additional first metal wires 261 and the additional second metal wires 262 in the case of the interdigitated vertical native capacitor 200) in the resulting capacitor structure in order to achieve a zero net coefficient (e.g., a zero net $V_{cc2}$ or a zero net $T_{cc}$). It should be noted that the any additional wire spacings (e.g., wire spacings 191, 291 between the connecting wires of one comb-shaped structure and the metal wires on the opposite comb-shaped structure) should be specified at this time such that these spacing are greater than the spacing 190, 290 between adjacent metal wires and, particularly, such that they are sufficiently great to avoid the occurrence of a capacitor breakdown mechanism anywhere other than between the interdigitated metal wires in the final capacitor structure 100 or 200.

Figure 12:
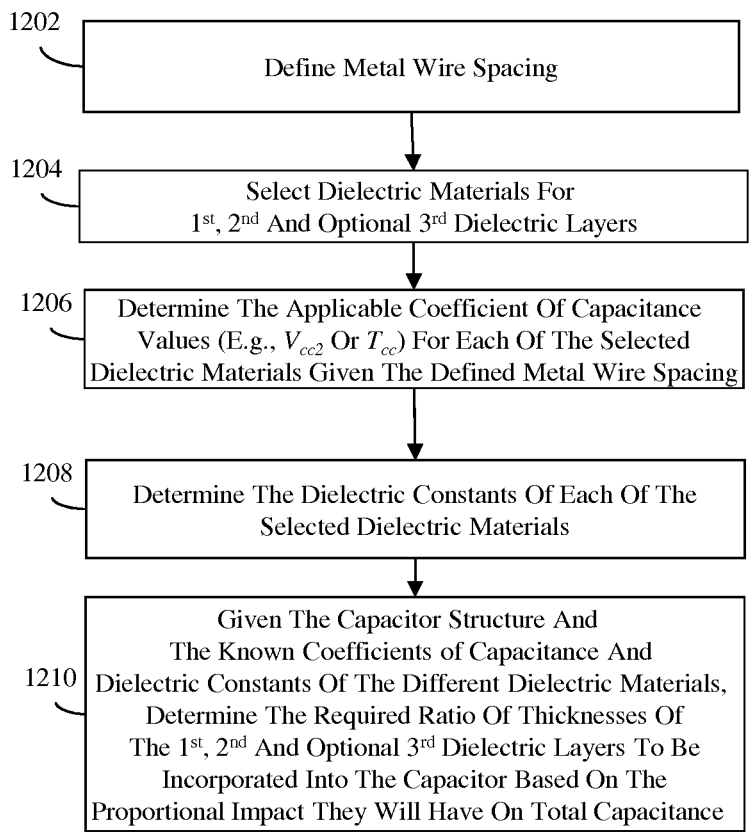
FIG. 12 is a flow diagram illustrating in greater detail the processes 606-608 of FIG. 6.

FIG. 12 is a flow diagram illustrating in greater details the processes 606-608 of FIG. 6. For example, referring to the flow diagram of FIG. 12 the process 606 can begin by defining the desired spacing 190, 290 to used between the first metal wires 151, 251 and the second metal wires 152, 252 in the resulting capacitor 100, 200 (1202). This spacing 190, 290 can comprise, for example, 100 nm, 300 nm, 500 nm, or any other suitable spacing. In one embodiment, the spacing 190, 290 used in the capacitors 100, 200 will be the same as the spacing used for metal wire interconnects or other metal wire structures within the same metal level(s). It should be noted that in the case of an interdigitated vertical native capacitor 200 this process 1202 further comprises defining the spacing 290 that is also between the additional first metal wires 261 and the additional second metal wires 262.

Next, the different dielectric materials to be used for the first dielectric layer 110, 210 and the second dielectric layer 120, 220 can be selected (1204).

Figure 13:
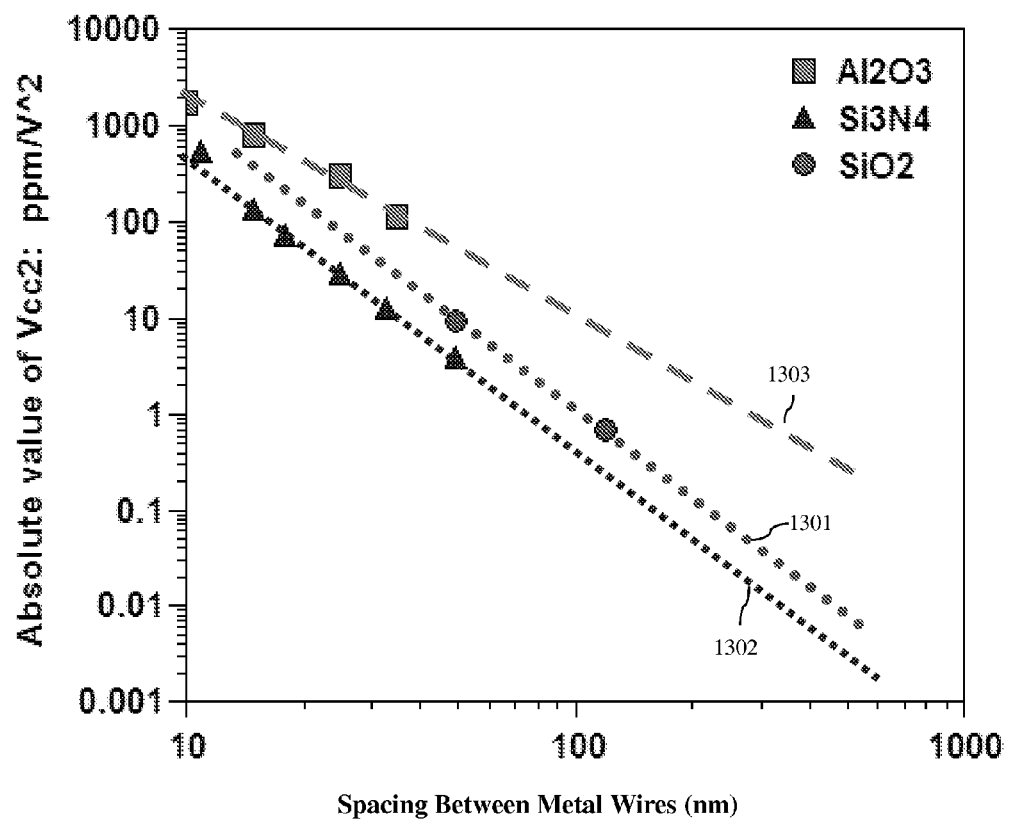
FIG. 13 is an exemplary $V_{cc}2$ to metal wire spacing graph.

Once the metal wire spacing 190, 290 is defined at process 1202 and the different dielectric materials are selected at process 1206, a database can be accessed to determine the applicable coefficient of capacitance values (e.g., the quadratic voltage coefficient of capacitance $V_{cc2}$ values or the linear temperature coefficient of capacitance $T_{cc}$ values) for each of the different dielectric materials given the metal wire spacing (1206). Specifically, coefficient of capacitance values with respect to a specific parameter can be maintained in a database (e.g., a table or graph) and stored in memory. For example, FIG. 13 is an exemplary graph with curves 1301-1303 illustrating the absolute value of the quadratic voltage coefficient of capacitance $V_{cc2}$ for each of three different dielectric materials (namely, silicon oxide ($SiO_2$) 1301, silicon nitride ($Si_3N_4$) 1302 and aluminum oxide ($Al_2O_3$) 1303) as a function of metal wire spacing. It should be noted that, while the graph of FIG. 13 illustrates the absolute values for $V_{cc}$, silicon oxide ($SiO_2$) has a negative quadratic voltage coefficient of capacitance (i.e., $-V_{cc2}$) and silicon nitride ($Si_3N_4$) and aluminum oxide ($Al_2O_3$) each have positive quadratic voltage coefficients of capacitance (i.e., $+V_{cc2}$). Such a table can be accessed at process 1206 to determine the quadratic voltage coefficient of capacitance $V_{cc2}$ values for the different dielectric materials given the metal wire spacing.

In addition, a database can also be accessed to determine the dielectric constants $\in$ of each of the different dielectric materials (1208). Specifically, dielectric constants $\in$ for the different dielectric materials can be maintained in a database (e.g., a table), stored in memory, and accessed as necessary. Once the applicable coefficient of capacitance values and the different dielectric constants for each of the different dielectric materials to be used as the first dielectric layer 110, 210 and second dielectric layer 120, 220 are determined, the required ratio of the thicknesses of the first and second dielectric layers necessary in order to achieve a zero net coefficient of capacitance (i.e., a zero net $V_{cc2}$ or a zero net $T_{cc}$) can be determined (1210). Specifically, given the capacitor structure and the known dielectric constants and coefficients of capacitance of the different dielectric materials selected for incorporation into the capacitor as the first dielectric layer 110, 210 and the second dielectric layer 120, 220, the ratio of the first thickness 111, 211 of the first dielectric layer 110, 210 to the second thickness 121, 221 of the second dielectric layer 120, 220 that is required to achieve a zero net coefficient of capacitance (i.e., a zero net $V_{cc2}$ or a zero net $T_{cc}$) can be calculated as a function of the proportional capacitive impact that each of the different dielectric layers with their respective dielectric constants, coefficients of capacitance and thicknesses will have on the total capacitance of the capacitor 100, 200 to complete process 608 of FIG. 6.

Figure 14:
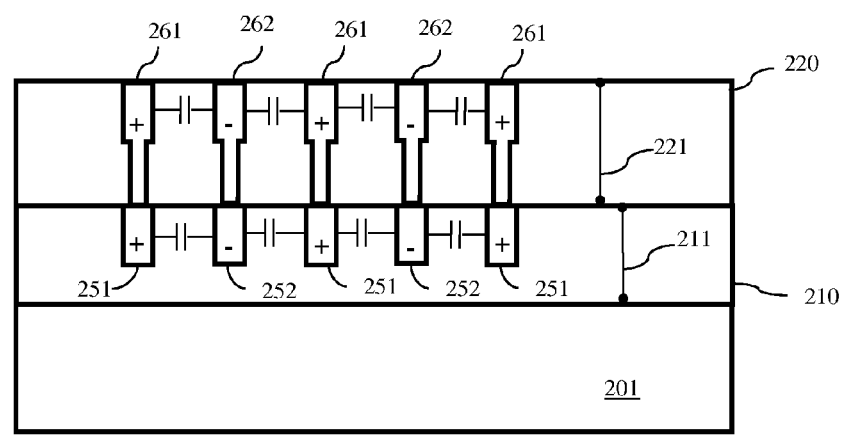
FIG. 14 is a vertical cross-section of the interdigitated vertical native capacitor of FIG. 2A appended to show vertical components therein.

For example, FIG. 14 illustrates the capacitive components of an exemplary interdigitated vertical native capacitor 200, such as that shown in FIGS. 2A-2C. In this case, the total capacitance ($C_{total}$) exhibited by this capacitor is equal to the sum of the first capacitances ($C_1$) between the first and second metal wires 251, 252 and the second capacitances ($C_2$) between the additional first and second metal wires 261, 262 (i.e., $C_{total}=C_1+C_2$). The quadratic term from the equation (2) above is, therefore, proportional to the following expression:

$$(\in_1 \beta_1 t_1)+(\in_2 \beta_2 t_2)=0, \qquad (3)$$

where $\in_1$ is the first dielectric constant of the first dielectric material of the first dielectric layer 210, $\beta_1$ is the first quadratic voltage coefficient of capacitance $V_{cc2}$ for that first dielectric material and $t_1$ is the first thickness 211 of the first dielectric layer 210, and where $\in_2$ is the second dielectric constant of the second dielectric material of the second dielectric layer 220, $\beta_1$ is the second quadratic voltage coefficient of capacitance $V_{cc2}$ for that second dielectric material and $t_2$ is the first thickness 221 of the second dielectric layer 220. Thus, the ratio of the first thickness $t_1$ 211 of the first dielectric layer 210 to the second thickness $t_2$ 221 of the second dielectric layer 220 can be expressed as follows:

$$\frac{t_2}{t_1} = \frac{\varepsilon_1}{\varepsilon_2} \frac{\beta_1}{\beta_2}. \qquad (4)$$

Using such a technique, in the simple interdigitated capacitor 100 of FIGS. 1A-1B or the interdigitated vertical native capacitor 200 of FIGS. 2A-2C, if the first dielectric layer 110, 210 comprises a silicon oxide ($SiO_2$) layer and the second dielectric layer 120 comprises a silicon nitride ($Si_3N_4$) layer, then the ratio of the first thickness 111, 211 to the second thickness 121, 221 can be as follows: 1:1.7 when the metal wire spacing 190, 290 is 100 nm, 1:1.2 when the metal wire spacing 190, 290 is 300 nm, or 1:1 when the metal wire spacing is 500 nm. However, in the same simple interdigitated capacitor 100 of FIGS. 1A-1B or the same interdigitated vertical native capacitor 200 of FIGS. 2A-2C, if the first dielectric layer 110, 210 comprises a silicon oxide ($SiO_2$) layer and the second dielectric layer 120 comprises an aluminum oxide ($Al_2O_3$) layer, then the ratio of the first thickness 111, 211 to the second thickness 121, 221 can be as follows:

20:1 when the metal wire spacing 190, 290 is 100 nm, 43:1 when the metal wire spacing 190, 290 is 300 nm, or 66:1 when the metal wire spacing is 500 nm. In any case, as a result, the negative $1^{st}$ $V_{cc2}$ of the first dielectric layer 110, 210 will be approximately equal in magnitude to the positive $2^{nd}$ $V_{cc2}$ of the second dielectric layer 120, 220 so that the capacitor 100, 200 has a zero net $V_{cc2}$.

It should further be noted that factors such as processing feasibility and/or impact on other on-chip components may make it impractical and/or impossible to form a capacitor in the manner described above such that it comprises a first dielectric layer having a desired first thickness to achieve a desired first coefficient of capacitance and/or a second dielectric layer having a desired second thickness to achieve a desired second coefficient of capacitance. As a result, the net coefficient of capacitance with respect to the specific parameter may be slightly above or below zero. In this case, specifications for a third dielectric layer 130, 230 to be incorporated into either the simple interdigitated capacitor 100 or the interdigitated vertical native capacitor 200 can be predefined at process 606 in order to fine tune the net coefficient of capacitance toward zero. Specifically, a third dielectric material and third thickness for a third dielectric layer to be incorporated into the capacitor 100 or 200 can be predefined at process 606 such that the third dielectric layer has a third coefficient of capacitance with respect to the specific parameter (e.g., a third linear temperature coefficient of capacitance ($3^{rd}$ $T_{cc}$) or a third quadratic voltage coefficient of capacitance ($3^{rd}$ $V_{cc2}$), as applicable). The third dielectric material and third thickness of the third dielectric layer can be predefined such that the third coefficient of capacitance has the same polarity as the first coefficient of capacitance, when the magnitude of the first coefficient of capacitance is less than that of the second, in order to make up for the difference (i.e., in order to move the net coefficient of capacitance toward zero and, preferably, to exactly zero). Alternatively, the third dielectric material and third thickness of the third dielectric layer can be predefined such that the third coefficient of capacitance has the same polarity as the second coefficient of capacitance, when the magnitude of the second coefficient of capacitance is less than that of the first, in order to make up for the difference (i.e., in order to move the net coefficient of capacitance toward zero and, preferably, to exactly zero). Such a third dielectric layer can then be formed at one or more different points in the manufacturing process.

For example, with regard to the simple interdigitated capacitor, in one exemplary embodiment, a third dielectric layer 130 having the third thickness can be formed during formation of the first dielectric layer at process 608 such that it is within the first dielectric layer 110 and, thereby such that the first metal wires 151 and the second metal wires 152 formed at process 610 will extend vertically through the third dielectric layer (as shown in FIG. 4A). In this case, the first dielectric layer 110, the second dielectric layer 120 and the third dielectric layer 130 can comprise three different dielectric materials (e.g., silicon oxide ($SiO_2$), silicon nitride ($Si_3N_4$) and aluminum oxide ($Al_2O_3$), respectively). Alternatively, the second dielectric layer 120 and the third dielectric layer 130 can comprise the same dielectric material (e.g., silicon nitride ($Si_3N_4$) or aluminum oxide ($Al_2O_3$)) and the first dielectric layer 110 can comprise a different dielectric material (e.g., silicon oxide ($SiO_2$)). In other exemplary embodiments, a third dielectric layer 130 having a third thickness 131 can be formed either prior to the formation of the second dielectric layer 120 at process 612 such that it is stacked between the first dielectric layer 110 and the second dielectric layer 120 (see FIG. 4B) or after formation of the second dielectric layer at process 612 such that it is stacked above the second dielectric layer 120 (see FIG. 4C). In these cases, the first dielectric layer 110, the second dielectric layer 120 and the third dielectric layer 130 can again comprise three different dielectric materials (e.g., silicon oxide (SiO2), silicon nitride ($Si_3N_4$) and aluminum oxide ($Al_2O_3$), respectively).

Similarly, with regard to the interdigitated vertical native capacitor 200 of FIG. 2A, in one exemplary embodiment, a third dielectric layer 230 having a third thickness 231 can be formed during formation of the first dielectric layer 210 at process 608 such that it is positioned within the first dielectric layer 210 and such that the first metal wires 251 and the second metal wires 252 formed at process 610 will extend vertically through the third dielectric layer (see FIG. 5A). Alternatively, a third dielectric layer 230 having a third thickness 231 can be formed during formation of the second dielectric layer 220 at process 612 such that it is within the second dielectric layer 220 and such that the additional first metal wires 261 and the additional second metal wires 262 and/or the vias 270 formed at process 614 extend vertically through the third dielectric layer (see FIG. 5B). In this case, the first dielectric layer 210, the second dielectric layer 220 and the third dielectric layer 230 can comprise three different dielectric materials (e.g., silicon oxide (SiO2), silicon nitride ($Si_3N_4$) and aluminum oxide ($Al_2O_3$), respectively). Alternatively, if the third dielectric layer 230 is within the first dielectric layer 210, the second dielectric layer 220 and the third dielectric layer 230 can comprise the same dielectric material (e.g., silicon nitride ($Si_3N_4$) or aluminum oxide ($Al_2O_3$)) and the first dielectric layer 210 can comprise a different dielectric material (e.g., silicon oxide ($SiO_2$)). In other exemplary embodiments, a third dielectric layer 230 having a third thickness 231 can be formed either prior to formation of the second dielectric layer 220 at process 612 such that it is stacked between the first dielectric layer 210 and the second dielectric layer 220 (see FIG. 5C) or after the formation of the second dielectric layer 220 such that it is stacked above the second dielectric layer 220 (see FIG. 5D). In these cases, the first dielectric layer 210, the second dielectric layer 220 and the third dielectric layer 230 can again comprise three different dielectric materials (e.g., silicon oxide (SiO2), silicon nitride ($Si_3N_4$) and aluminum oxide ($Al_2O_3$), respectively).

Also disclosed herein is a design structure for the above-described capacitors. Specifically, this design structure (e.g., a hardware description language (HDL) design structure) can be encoded on a machine-readable data storage medium. It can, for example, comprise data and instruction elements that are executable by a computer in a computer-aided design system in order to generate a machine-executable representation of any of the above-described capacitors.

Figure 15:
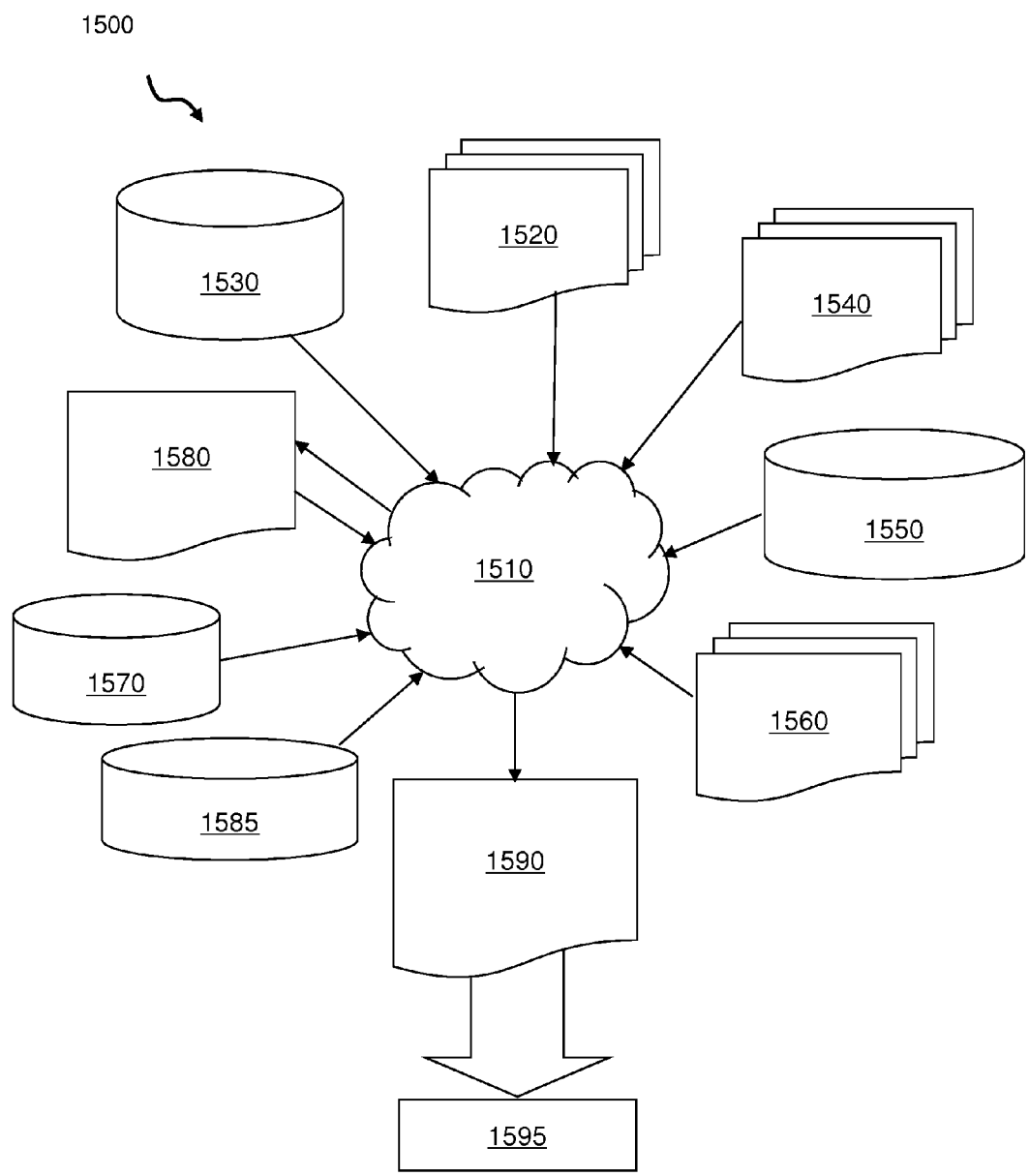
FIG. 15 is a block diagram illustrating an exemplary design flow.

More particularly, FIG. 15 shows a block diagram of an exemplary design flow 1500 used for example, in semiconductor IC logic design, simulation, test, layout, and manufacture. Design flow 1500 includes processes, machines and/or mechanisms for processing design structures or devices to generate logically or otherwise functionally equivalent representations of the design structures and/or devices described above and shown in FIGS. 1A-1B and 2A-2C. The design structures processed and/or generated by design flow 1500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1500 may vary depending on the type of representation being designed. For example, a design flow 1500 for building an application specific IC (ASIC) may differ from a design flow 1500 for designing a standard component or from a design flow 1500 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 1520 that is preferably processed by a design process 1510. Design structure 1520 may be a logical simulation design structure generated and processed by design process 1510 to produce a logically equivalent functional representation of a hardware device. Design structure 1520 may also or alternatively comprise data and/or program instructions that when processed by design process 1510, generate a functional representation of the physical structure of a hardware device. Whether representing functional and/or structural design features, design structure 1520 may be generated using electronic computer-aided design (ECAD) such as implemented by a core developer/designer. When encoded on a machine-readable data transmission, gate array, or storage medium, design structure 1520 may be accessed and processed by one or more hardware and/or software modules within design process 1510 to simulate or otherwise functionally represent an electronic component, circuit, electronic or logic module, apparatus, device, or system such as those shown in FIGS. 1A-1B and 2A-2C. As such, design structure 1520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1510 preferably employs and incorporates hardware and/or software modules for synthesizing, translating, or otherwise processing a design/simulation functional equivalent of the components, circuits, devices, or logic structures shown in FIGS. 1A-1B and 2A-2C to generate a netlist 1580 which may contain design structures such as design structure 1520. Netlist 1580 may comprise, for example, compiled or otherwise processed data structures representing a list of wires, discrete components, logic gates, control circuits, I/O devices, models, etc. that describes the connections to other elements and circuits in an integrated circuit design. Netlist 1580 may be synthesized using an iterative process in which netlist 1580 is resynthesized one or more times depending on design specifications and parameters for the device. As with other design structure types described herein, netlist 1580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1510 may include hardware and software modules for processing a variety of input data structure types including Netlist 1580. Such data structure types may reside, for example, within library elements 1530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1540, characterization data 1550, verification data 1560, design rules 1570, and test data files 1585 which may include input test patterns, output test results, and other testing information. Design process 1510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1510 without deviating from the scope and spirit of the invention. Design process 1510 may also include modules for performing standard circuit design processes such as timing analysis, verification, design rule checking, place and route operations, etc.

Design process 1510 employs and incorporates logic and physical design tools such as HDL compilers and simulation model build tools to process design structure 1520 together with some or all of the depicted supporting data structures along with any additional mechanical design or data (if applicable), to generate a second design structure 1590. Design structure 1590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1520, design structure 1590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A-1B and 2A-2C. In one embodiment, design structure 1590 may comprise a compiled, executable HDL simulation model that functionally simulates the devices shown in FIGS. 1A-1B and 2A-2C.

Design structure 1590 may also employ a data format used for the exchange of layout data of integrated circuits and/or symbolic data format (e.g. information stored in a GDSII (GDS2), GL1, OASIS, map files, or any other suitable format for storing such design data structures). Design structure 1590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1A-1B and 2A-2C. Design structure 1590 may then proceed to a stage 1595 where, for example, design structure 1590: proceeds to tape-out, is released to manufacturing, is released to a mask house, is sent to another design house, is sent back to the customer, etc.

Figure 16:
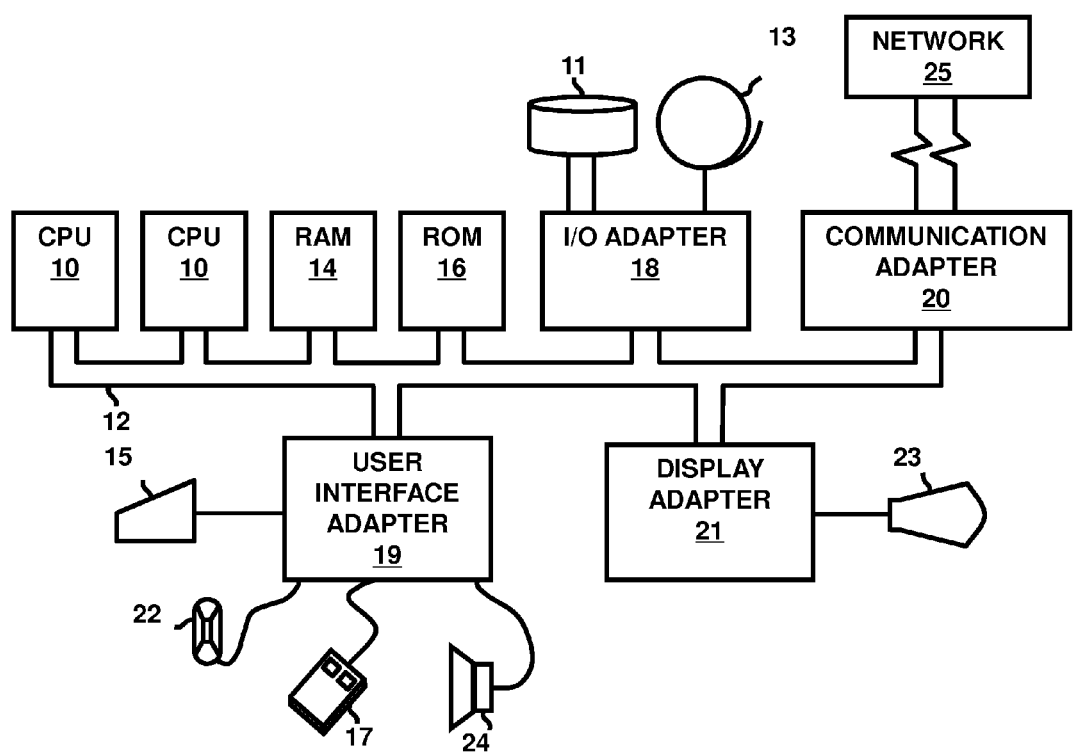
FIG. 16 a schematic diagram illustrating an exemplary hardware environment for implementing the design flow of FIG. 15.

FIG. 16 depicts a representative hardware environment for implementing the design flow described above as well as for predefining the specifications of the dielectric layers at process 606 of the methods described above. This schematic drawing illustrates a hardware configuration of an information handling/computer. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the disclosed method embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products disclosed herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is not intended to be limiting. For example, as used herein, the singular forms "a", "an" and "the" are intended to include the plural forms as well, unless the context clearly indicates otherwise. It should further be understood that the terms "comprises" "comprising", "includes" and/or "including", as used herein, specify the presence of stated features, integers, steps, operations, elements, and/or components, but do not preclude the presence or addition of one or more other features, integers, steps, operations, elements, components, and/or groups thereof. Additionally, the descriptions of the structures and methods disclosed herein have been presented for purposes of illustration, but are not intended to be exhaustive or limiting, as disclosed. Many modifications and variations will be apparent to those of ordinary skill in the art without departing from the scope and spirit of the disclosed structures and methods. The terminology used herein was chosen to best explain the principles of the disclosed structures and methods, the practical application or technical improvement over technologies found in the marketplace, or to enable others of ordinary skill in the art to understand the disclosed structures and methods.

Therefore, disclosed above are capacitors and, particularly, a simple interdigitated capacitor and an interdigitated vertical native capacitor, each having a relatively low (e.g., zero) net coefficient of capacitance with respect to a specific parameter so as to limit capacitance variation as a function of that specific parameter. For example, the capacitors can have a relatively low (e.g., zero) net linear temperature coefficient of capacitance (zero net $T_{cc}$) to limit capacitance variation as a function of temperature (e.g., in high temperature applications). Alternatively, the capacitors can have a relatively low (e.g., zero) net quadratic voltage coefficient of capacitance (zero net $V_{cc2}$) to limit capacitance variation as a function of voltage (e.g., in high voltage applications). In any case, each capacitor can incorporate at least two different plate dielectrics. The two different plate dielectrics can have different and, particularly, opposite polarity coefficients of capacitance with respect to the specific parameter due to the types of dielectric materials used and their respective thicknesses. As a result, the different dielectric plates will have opposite effects on the capacitance of the capacitor and these opposite effects will cancel each other out such that the capacitor has a relatively low (e.g., zero) net coefficient of capacitance with respect to the specific parameter.

What is claimed is:

1. A capacitor comprising:
   a first dielectric layer comprising a first dielectric material,
      said first dielectric layer having a top surface and a first thickness, and
      said first dielectric layer further having a first coefficient of capacitance with respect to a specific parameter;
   first metal wires and second metal wires in said first dielectric layer at said top surface,
      said first metal wires being interdigitated with said second metal wires, being physical separated from said second metal wires by spaces, and further being electrically isolated from said second metal wires by said first dielectric material in said spaces; and
   a second dielectric layer on said top surface and extending laterally over said first metal wires and said second metal wires,
      said second dielectric layer comprising a second dielectric material different from said first dielectric material and having a second thickness that is different from said first thickness, and
      said second dielectric layer further having a second coefficient of capacitance with respect to said specific parameter,
   said first coefficient of capacitance and said second coefficient of capacitance having opposite polarities, said spaces physically separating said first metal wires from said second metal wires being a predetermined length, and said first thickness to said second thickness being a predetermined ratio such that said capacitor has a specific net coefficient of capacitance of approximately zero with respect to said specific parameter.

2. The capacitor of claim 1, further comprising a third dielectric layer having a third coefficient of capacitance with respect to said specific parameter so as to fine tune said specific net coefficient of capacitance to zero, said third dielectric layer being any one of the following:
   within said first dielectric layer such that said first metal wires and said second metal wires extend vertically through said third dielectric layer;
   stacked between said first dielectric layer and said second dielectric layer; and
   stacked above said second dielectric layer.

3. The capacitor of claim 2, said first dielectric layer, said second dielectric layer and said third dielectric layer comprising different dielectric materials.

4. The capacitor of claim 2, said third dielectric layer being within said first dielectric layer and said second dielectric layer and said third dielectric layer comprising a same dielectric material.

5. The capacitor of claim 1, said specific parameter comprising temperature and said first coefficient of capacitance and said second coefficient of capacitance each comprising a linear temperature coefficient of capacitance.

6. The capacitor of claim 1, said specific parameter comprising voltage and said first coefficient of capacitance and said second coefficient of capacitance each comprising a quadratic voltage coefficient of capacitance.

7. The capacitor of claim 6, said first dielectric layer comprising silicon oxide and having a negative quadratic voltage coefficient of capacitance and said second dielectric layer comprising any one of silicon nitride and aluminum oxide and having a positive quadratic voltage coefficient of capacitance.

8. The capacitor of claim 1, further comprising:
additional first metal wires in said second dielectric layer aligned above and electrically connected to said first metal wires; and
additional second metal wires in said second dielectric layer aligned above and electrically connected to said second metal wires, said additional second metal wires further being interdigitated with and electrically isolated from said additional first metal wires.

9. The capacitor of claim 8, further comprising a third dielectric layer having a third coefficient of capacitance with respect to said specific parameter so as to fine tune said specific net coefficient of capacitance to be equal to zero, said third dielectric layer being any one of the following:
within said first dielectric layer such that said first metal wires and said second metal wires extend vertically through said third dielectric layer;
within said second dielectric layer such that said additional first metal wires and said additional second metal wires extend vertically through said third dielectric layer; and
stacked between said first dielectric layer and said second dielectric layer.

10. A hardware description language (HDL) design structure encoded on a machine-readable data storage medium, said HDL design structure comprising data and instruction elements that are executable by a computer in a computer-aided design system in order to generate a machine-executable representation of a capacitor, said capacitor comprising:
a first dielectric layer comprising a first dielectric material, said first dielectric layer having a top surface and a first thickness, and
said first dielectric layer further having a first coefficient of capacitance with respect to a specific parameter;
first metal wires and second metal wires in said first dielectric layer at said top surface, said first metal wires being interdigitated with said second metal wires, being physical separated form said second metal wires by spaces, and further being electrically isolated from said second metal wires by said first dielectric material; and
a second dielectric layer on said top surface and extending laterally over said first metal wires and said second metal wires,
said second dielectric layer comprising a second dielectric material different from said first dielectric material and having a second thickness that is different from said first thickness, and
said second dielectric layer further having a second coefficient of capacitance with respect to said specific parameter,
said first coefficient of capacitance and said second coefficient of capacitance having opposite polarities, said spaces physically separating said first metal wires from said second metal wires being a predetermined length, and said first thickness to said second thickness being a predetermined ratio such that said capacitor has a specific net coefficient of capacitance of approximately zero with respect to said specific parameter.

11. The capacitor of claim 1, said specific parameter comprising voltage, said first dielectric material comprising silicon oxide having a negative quadratic voltage coefficient of capacitance, said second dielectric material comprising silicon nitride having a positive quadratic voltage coefficient of capacitance, and said predetermined ratio being one of the following:
1:1.7 when said predetermined length of said spaces physically separating said first metal wires from said second metal wires is 100 nm;
1:1.2 when said predetermined length of said spaces physically separating said first metal wires from said second metal wires is 100 nm; and,
1:1 when said predetermined length of said spaces physically separating said first metal wires from said second metal wires is 500 nm.

12. The capacitor of claim 1, said specific parameter comprising voltage, said first dielectric material comprising silicon oxide having a negative quadratic voltage coefficient of capacitance, said second dielectric material comprising aluminum oxide having a positive quadratic voltage coefficient of capacitance, and said predetermined ratio being one of the following:
20.1 when said predetermined length of said spaces physically separating said first metal wires from said second metal wires is 100 nm;
43:1 when said predetermined length of said spaces physically separating said first metal wires from said second metal wires is 100 nm; and,
66:1 when said predetermined length of said spaces physically separating said first metal wires from said second metal wires is 500 nm.

13. A capacitor comprising:
a first dielectric layer comprising a first dielectric material, said first dielectric layer having a top surface and a first thickness, and
said first dielectric layer further having a first quadratic voltage coefficient of capacitance with respect to a specific parameter, said specific parameter comprising voltage;
first metal wires and second metal wires in said first dielectric layer at said top surface,
said first metal wires being interdigitated with said second metal wires, being physical separated from said second metal wires by spaces, and further being electrically isolated from said second metal wires by said first dielectric material in said spaces; and
a second dielectric layer on said top surface and extending laterally over said first metal wires and said second metal wires,
said second dielectric layer comprising a second dielectric material different from said first dielectric material and having a second thickness that is different from said first thickness, and said second dielectric layer further having a second quadratic voltage coefficient of capacitance with respect to said specific parameter, said first quadratic voltage coefficient of capacitance and said second quadratic voltage coefficient of capacitance having opposite polarities, said spaces physically separating said first metal wires from said second metal wires being a predetermined length, and said first thickness to said second thickness being a predetermined ratio such that said capacitor has a specific net quadratic voltage coefficient of capacitance of approximately zero with respect to said specific parameter.

14. The capacitor of claim 13, said first dielectric material comprising silicon oxide having a negative quadratic voltage coefficient of capacitance, said second dielectric material comprising silicon nitride having a positive quadratic voltage coefficient of capacitance, and said predetermined ratio being one of the following:
- 1:1.7 when said predetermined length of said spaces physically separating said first metal wires from said second metal wires is 100 nm;
- 1:1.2 when said predetermined length of said spaces physically separating said first metal wires from said second metal wires is 100 nm; and,
- 1:1 when said predetermined length of said spaces physically separating said first metal wires from said second metal wires is 500 nm.

15. The capacitor of claim 13, said first dielectric material comprising silicon oxide having a negative quadratic voltage coefficient of capacitance, said second dielectric material comprising aluminum oxide having a positive quadratic voltage coefficient of capacitance, and said predetermined ratio being one of the following:
- 20.1 when said predetermined length of said spaces physically separating said first metal wires from said second metal wires is 100 nm;
- 43:1 when said predetermined length of said spaces physically separating said first metal wires from said second metal wires is 100 nm; and,
- 66:1 when said predetermined length of said spaces physically separating said first metal wires from said second metal wires is 500 nm.

16. The capacitor of claim 13, further comprising a third dielectric layer having a third quadratic voltage coefficient of capacitance with respect to said specific parameter so as to fine tune said specific net coefficient of capacitance to zero, said third dielectric layer being any one of the following:
- within said first dielectric layer such that said first metal wires and said second metal wires extend vertically through said third dielectric layer;
- stacked between said first dielectric layer and said second dielectric layer; and
- stacked above said second dielectric layer.

17. The capacitor of claim 16, said first dielectric layer, said second dielectric layer and said third dielectric layer comprising different dielectric materials.

18. The capacitor of claim 16, said third dielectric layer being within said first dielectric layer and said second dielectric layer and said third dielectric layer comprising a same dielectric material.

19. The capacitor of claim 13, said first dielectric layer comprising silicon oxide and having a negative quadratic voltage coefficient of capacitance and said second dielectric layer comprising any one of silicon nitride and aluminum oxide and having a positive quadratic voltage coefficient of capacitance.

20. The capacitor of claim 13, further comprising:
- additional first metal wires in said second dielectric layer aligned above and electrically connected to said first metal wires; and
- additional second metal wires in said second dielectric layer aligned above and electrically connected to said second metal wires, said additional second metal wires further being interdigitated with and electrically isolated from said additional first metal wires.

* * * * *